US012813241B2

(12) United States Patent
Shih et al.

(10) Patent No.: US 12,813,241 B2
(45) Date of Patent: Nov. 24, 2026

(54) SEMICONDUCTOR DEVICE HAVING THROUGH VIA AND METHOD OF FABRICATING THEREOF

(71) Applicant: Taiwan Semiconductor Manufacturing Company, Ltd., Hsinchu (TW)

(72) Inventors: Yang-Hsin Shih, Hsinchu City (TW); Mao-Nan Wang, Kaohsiung City (TW); Chih-Hsin Yang, Hsinchu County (TW); Liang-Wei Wang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 864 days.

(21) Appl. No.: 18/307,549

(22) Filed: Apr. 26, 2023

(65) Prior Publication Data

US 2024/0363492 A1 Oct. 31, 2024

(51) Int. Cl.

| | |
|---|---|
| ***H10W 20/20*** | (2026.01) |
| ***H10D 64/01*** | (2025.01) |
| ***H10D 84/01*** | (2026.01) |
| ***H10D 84/03*** | (2025.01) |
| ***H10D 84/83*** | (2025.01) |
| ***H10W 20/00*** | (2026.01) |
| ***H10W 20/42*** | (2026.01) |

(52) U.S. Cl.

CPC .......... *H10W 20/20* (2026.01); *H10D 64/017* (2025.01); *H10D 84/0186* (2025.01); *H10D 84/038* (2025.01); *H10D 84/83* (2025.01); *H10W 20/023* (2026.01); *H10W 20/056* (2026.01); *H10W 20/42* (2026.01)

(58) Field of Classification Search

CPC ... H10W 20/023; H10W 20/20; H10W 20/42; H10D 84/038; H10D 84/833; H10D 84/83; H10D 64/017

See application file for complete search history.

(56) References Cited

U.S. PATENT DOCUMENTS

| | | | | |
|---|---|---|---|---|
| 7,564,115 | B2 | 7/2009 | Chen | |
| 7,825,024 | B2 | 11/2010 | Lin | |
| 7,969,013 | B2 | 6/2011 | Chen | |
| 8,399,354 | B2 | 3/2013 | Chen | |
| 2013/0154048 | A1* | 6/2013 | Lu ...................... | H10D 84/0151 438/667 |
| 2020/0020734 | A1* | 1/2020 | Wang .................... | H10F 39/011 |
| 2020/0098828 | A1 | 3/2020 | Chen | |
| 2021/0249365 | A1* | 8/2021 | Liu ..................... | H10W 20/023 |
| 2023/0037554 | A1 | 2/2023 | Li | |

(Continued)

FOREIGN PATENT DOCUMENTS

TW 201712837 A 4/2017

*Primary Examiner* — John M Parker

(74) *Attorney, Agent, or Firm* — HAYNES AND BOONE, LLP

(57) ABSTRACT

Semiconductor structures and methods for forming the same that include a through substrate via. Sacrificial gate structures are formed concurrently with active gate structures, the sacrificial gate structures being disposed in a through via region of the substrate. The sacrificial gate structures are subsequently removed from the substrate and dielectric material formed in their place. The through substrate via extends through the dielectric material.

20 Claims, 17 Drawing Sheets

(56) References Cited

U.S. PATENT DOCUMENTS

| | | | | |
|---|---|---|---|---|
| 2023/0069716 | A1 | 3/2023 | Jiang | |
| 2024/0021498 | A1 * | 1/2024 | Shigetoshi .......... | H10W 20/023 |
| 2024/0071956 | A1 * | 2/2024 | Yang .................. | H10D 84/0149 |

* cited by examiner

SEMICONDUCTOR DEVICE HAVING THROUGH VIA AND METHOD OF FABRICATING THEREOF

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

More recent attempts have focused on through vias, e.g., through-silicon or through-substrate vias (TSVs). TSVs have found applications in three-dimensional (3D) ICs for routing electrical signal from one side of a silicon substrate of an IC to the other side thereof. Generally, a TSV is formed by etching a vertical via opening through a substrate and filling the via opening with a conductive material. While existing TSV structures and methods of fabricating thereof are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
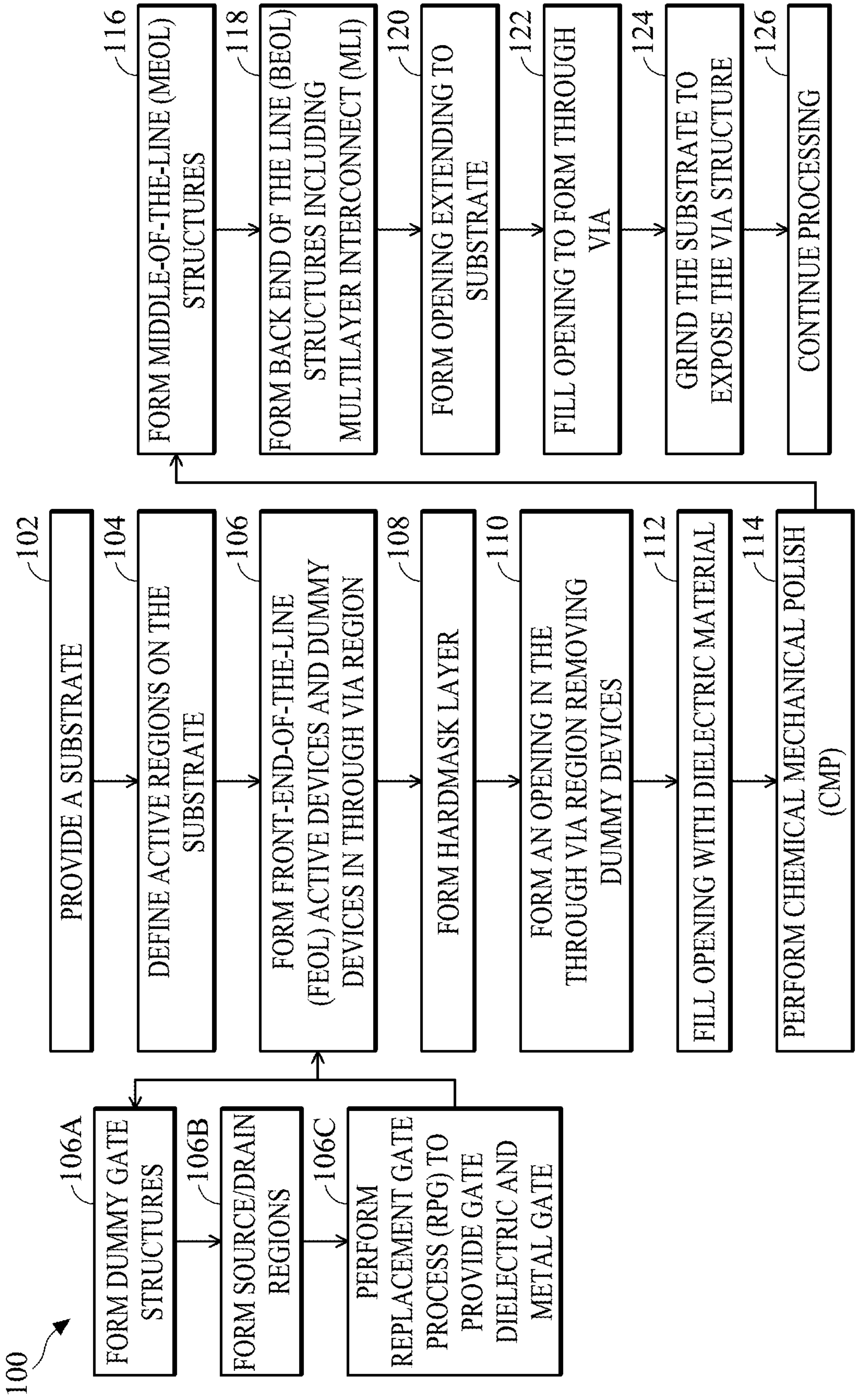
FIG. 1 is a flow chart illustrating an embodiment of a method of forming a device structure and a via structure through the device structure, according to various aspects of the present disclosure.

The present disclosure relates generally to integrated circuit devices, and more particularly, to interconnect structures for integrated circuit devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An interconnect structure electrically couples various components (for example, transistors, resistors, capacitors, and/or inductors) fabricated on a substrate, such that the various components can operate as specified by design requirements. An interconnect structure includes a combination of dielectric layers and conductive layers configured to provide electrical signal routing. The conductive layers include via and contact features that provide vertical connections and conductive lines that provide horizontal connections. In some implementations, an interconnect structure may have multiple metal layers (or metallization layers) that are vertically interconnected by via or contact features, and can be referred to as a multi-layer interconnect (MLI) structure. During operation of the IC device, the interconnect structure routes signals among the components of the IC device and/or distribute signals (for example, clock signals, voltage signals, and/or ground signals) to the components. An interconnect structure is formed in a back-end-of-the-line (BEOL) process, typically formed after the front-end-of-the-line (FEOL) process forms the active devices such as a transistor on a substrate and the middle-end-of-the-line (MEOL) process forms contacts to the active devices, such as conductive plugs to source/drain regions and gate structures.

In some implementations, there is a need to provide a vertical interconnect that extends through the interconnect structure and/or the substrate to facilitate various device structures, such as CMOS image sensors (CISs), a three-dimensional integrated circuit (3DIC), MEMS devices, radio frequency (RF) devices, wafer-on-wafer (WoW) devices, and so on. Such a vertical interconnect may be referred to as a through via, or a through-silicon or through-substrate via (TSV) as it extends through, in whole or in part, the semiconductor substrate. The term through via or TSV in the present disclosure broadly encompasses via structures that provide direct signal routing from a frontside of the substrate and a backside of the substrate or vice versa. The TSV may extend vertically through not only the substrate, but the BEOL, MEOL, and/or FEOL regions of the device.

The through via, and the regions that the through via are formed within, typically span relatively large areas of the substrate. In some implementations, through vias are larger than active devices (e.g., transistors formed in the FEOL processes) of the device. Thus, regions of through vias may have vastly different pattern densities than the active device regions. Leaving a larger region vacant for receiving the through via when forming the semiconductor device (e.g., forming FEOL, MEOL or BEOL structures) can cause processing challenges. For example, due the pattern density differences, inconsistent processing can occur in the through via region. In an embodiment, dishing can occur in the through via region during processes such as chemical mechanical processing (CMP) processes. The dishing in turn leads to other processing issues—such as gate profile development (e.g., polysilicon dummy gate structures).

Through vias may be formed in or after a BEOL process, separated from FEOL and MEOL processes. The present disclosure provides a method and semiconductor structure that addresses the through via region during the FEOL feature formation. For example, by also forming features in the through via region during the FEOL processes, pattern uniformity is improved. And, thus, processing challenges may be mitigated, such as reduction in dishing. In some embodiments, the FEOL processes include forming sacrificial gates in the through via region, concurrently with formation of active transistor gates. In other words, in some implementations, metal gates are formed through replacement gate processes not only in the active regions, but in the through via region. These gates in the through via region are referred to as sacrificial as they are later removed from the through via region.

The various aspects of the present disclosure will now be described in more detail with reference to the figures. In that regard, FIG. 1 is a flowchart illustrating a method 100 of forming a device structure exemplified by a device 200 (shown in FIGS. 2-13) including a through via structure, according to various aspects of the present disclosure. The method 100 is merely an example and is not intended to limit the present disclosure to what is explicitly illustrated in the method 100. Additional steps can be provided before, during and after the method 100, and some steps described can be replaced, eliminated, or moved around for additional embodiments of the method. Not all steps are described herein in detail for reasons of simplicity. The method 100 is described below in conjunction with FIGS. 2-13, which are fragmentary cross-sectional views and top views of the device 200 at different stages of fabrication according to various embodiments of the method 100. Throughout the present disclosure, unless expressly otherwise described, like reference numerals denote like features.

The device 200 shown in the figures of the present disclosure is simplified and not all features in the device 200 are illustrated or described in detail. The device 200 shown in the figures may be a portion of an IC chip, a system on chip (SoC), or portion thereof, that may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some implementations, the device 200 and the formed through via is interconnected with another device, such as another device 200, for example in a stacked formation.

Figure 2A:
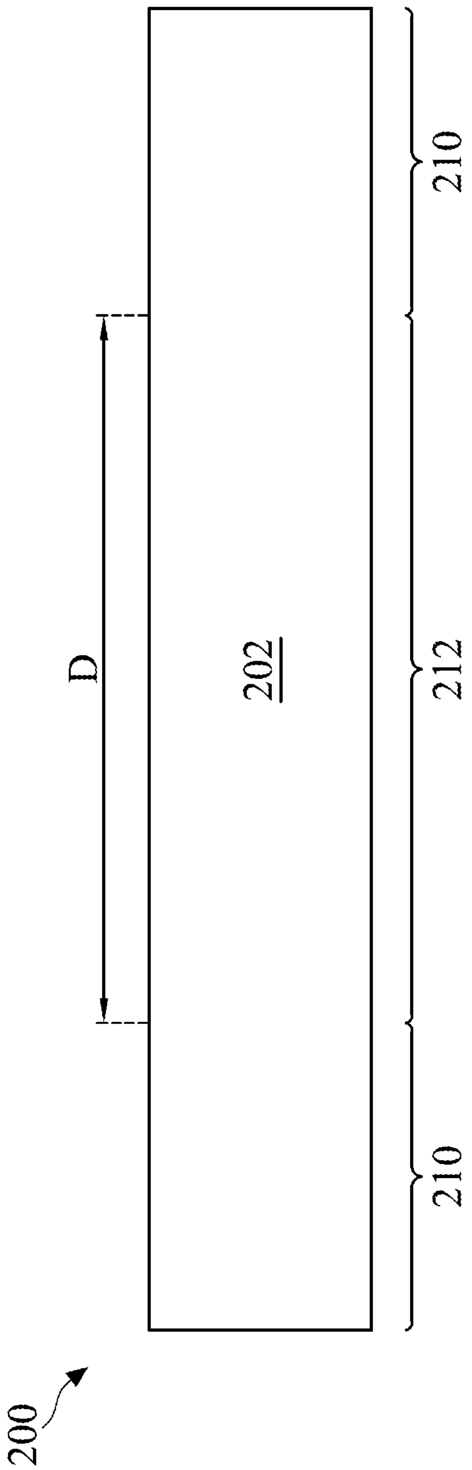
FIGS. 2A, 3, 4, 5A, 6, 7A, 8, 9, 10, 11, 12A, 13, and 14 are fragmentary cross-sectional views of a workpiece undergoing operations of the method in FIG. 1, according to various aspects of the present disclosure.
Figure 2B:
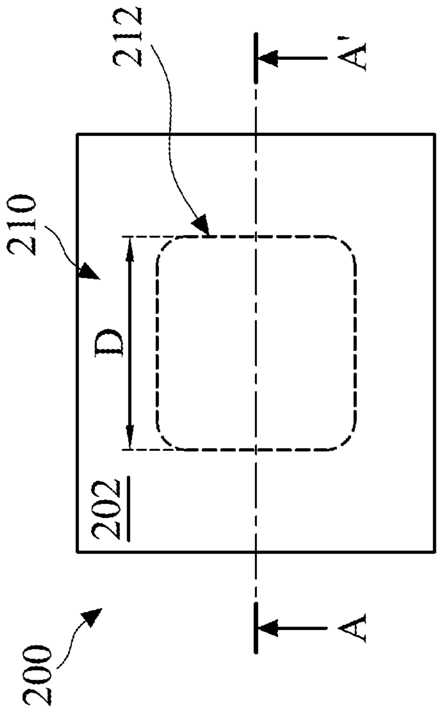
FIGS. 2B, 5B, 7B and 12B are top views of the workpiece undergoing operations of the method in FIG. 1, according to various aspects of the present disclosure.

Referring to FIGS. 1 and 2, the method 100 includes a block 102 where a substrate 202 is provided. The substrate 202 is a part of the device 200, which will include further structures as the method 100 progresses. In an embodiment, the substrate 202 includes silicon (Si). Alternatively or additionally, the substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. The substrate 202 can include various doped regions (not shown) depending on design requirements of the device 200. In some implementations, the substrate 202 includes p-type doped regions (for example, p-type wells) doped with p-type dopants, such as boron (for example, $BF_2$), indium, other p-type dopant, or combinations thereof. In some implementations, the substrate 202 includes n-type doped regions (for example, n-type wells) doped with n-type dopants, such as phosphorus (P), arsenic (As), other n-type dopant, or combinations thereof. In some implementations, the substrate 202 includes doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or other suitable doping process can be performed to form the various doped regions.

The method 100 includes a block 104 where active regions are formed on the substrate 202 in an FEOL process. In some implementations, the active regions are formed in fin-like regions such as provided when forming fin-type field effect transistors (FinFETs). In some implementations, the active regions are designed to form other multi-gate devices such as gate-all-around (GAA) transistors. A GAA transistor has a gate structure that can extend, partially or fully, around a channel region to provide access to the channel region on two or more sides. The channel regions may include nanowire, nanosheets, or other shaped nano-structures. In some implementations, the active regions are planar such as formed in the formation of planar transistors. Between active regions, there may be isolation regions such as shallow trench isolation (STI) features, extending between active regions (e.g., fins or planar regions). See isolation structures 204.

In some implementations, fins may be formed by directly patterning a top portion of the substrate 202, such that the fins protrude from the substrate 202. The fins may also be formed by epitaxially growing an epitaxial stack of first semiconductor layers (e.g., Si) and second semiconductor layers (e.g., SiGe) alternatively disposed one on another over the substrate 202 (not explicitly shown in FIG. 3) and then patterning to form the individual fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins by etching the initial epitaxial semiconductor layers.

In some implementations, the active regions formation includes forming a stack of a plurality of channel layers interleaved by a plurality of sacrificial layers. The layers in the stack may be deposited over the substrate 202 using an epitaxial process. Example epitaxial process may include vapor-phase epitaxy (VPE), ultra-high vacuum CVD (UHV-CVD)), molecular beam epitaxy (MBE), and/or other suitable processes. The channel layers and the sacrificial layers may have different semiconductor compositions. In some implementations, the channel layers are formed of silicon (Si) and sacrificial layers are formed of silicon germanium (SiGe). The additional germanium (Ge) content in the sacrificial layers allow selective removal or recess of the sacrificial layers without substantial damages to the channel layers. The sacrificial layers and the channel layers are disposed alternatingly such that sacrificial layers interleave the channel layers. The number of layers depends on the desired number of channels regions for the device 200. In some embodiments, the number of the channel layers is between 1 and 6.

In some implementations, certain regions of the substrate 202 are designated to be regions for device formation including front-end-of-the-line (FEOL) active devices such as transistors, back-end-of the line (BEOL) structures such as multi-layer interconnects (MLI), capacitors, memory structures, passive devices, and/or other suitable structures. These areas are referred to as device areas, illustrated as device region 210 in FIG. 2. The device region 210 include active regions and surrounding insulating regions (e.g., isolation structures such as STI) disposed between active regions. Other regions of the substrate 202 are designated to be regions for through via formation (also referred to as through-substrate vias (TSV)), illustrated as through via region 212 in FIG. 2. In some implementations, the through via region 212 has a dimension of D. In some embodiment, the dimension D is for example, 5 microns or greater. In an embodiment, the through via region 212 has a D of approximately 6 μm. In an embodiment, the through via region 212 has a D of between approximately 5 μm and 10 μm. It is noted there are a plurality of through via regions 212 and device regions 210 per substrate 202. The dimension D may be measured in any and/or all of the directions of the through via region 212. The dimension D may be significantly larger (e.g., 5 times) that of the size of a feature of device such as the gate structure.

In some implementations, the through via region 212 is approximately circular in a top view. In some implementations, the through via region 212 is of oval shape in a top view where at least one dimension is D as described above. In some implementations, the through via region 212 is of a rectangular shape (including square) from a top view where at least one dimension is D as described above. These shapes are exemplary only and other shapes are possible including, for example, an octagonal shape. In some embodiments, the through via region 212 is defined to be the same shape as the through via or TSV subsequently formed. In other embodiments, the through via region 212 may be of a different shape than the TSV subsequently formed. In each case, the through via region 212 encases the TSV to be formed. In other words, the through via region 212 is at least as large as the TSV. It is also noted that the through via region 212 also encases the dielectric material formed around the TSV (see, e.g., dielectric material 602) as discussed below.

While illustrated on a substrate 202, the through via region 212 and the device region 210 may also be defined in the design data associated with the device 200. In an embodiment, the through via region 212 and the device 210 are defined in the layout data associated with the device 200. The layout data may follow design rule checker (DRC) software or data that define the through via region in a manner that does not allow placement of active devices of the device 200 in said region. The layout defining the device region 210 and the through via region 212 may be defined in a layout database such as GDS, GDSII, OASIS, and/or other suitable layout formats.

The method 100 includes a block 106 where front-end-of-the-line (FEOL) devices are formed on the substrate active areas of the device region. In some implementations, the FEOL devices include transistor elements such as source/drain regions and/or gate structures. These FEOL devices are also referred to as active FEOL devices as they form the functionality of the device 200. Concurrently with the formation of active FEOL active devices, sacrificial FEOL devices commensurate in structure with the active FEOL devices, may be formed in a through via region of the substrate. As discussed in the steps of the method 100 below, these sacrificial FEOL devices may be subsequently removed.

The active and sacrificial FEOL devices may be formed by various steps including, in an example, those illustrated in sub-step 106A, sub-step 106B, and sub-step 106C. These steps are exemplary only and not intended to be limiting. Other methods may be used to form the FEOL devices. The FEOL devices formed, active FEOL devices and/or sacrificial FEOL devices may be features of GAA devices, FinFET devices, CFET devices, planar transistors, and/or other device structures.

In an embodiment, block 106 begins at sub-step 106A where dummy gate structures are formed in the device region and the through via region. The dummy gate structures are formed in both the device region 210 and the through via region 212. In some implementations, the gate structures are formed in the device region 210 and the through via region 212 in substantially the same pattern density. In an embodiment, the pitch of the gate structures in the device region 210 is the same as the pitch of the gate structures in the through via region 212. Typically, a plurality (two or more) gate structures are formed across the through via region 212.

Figure 3:
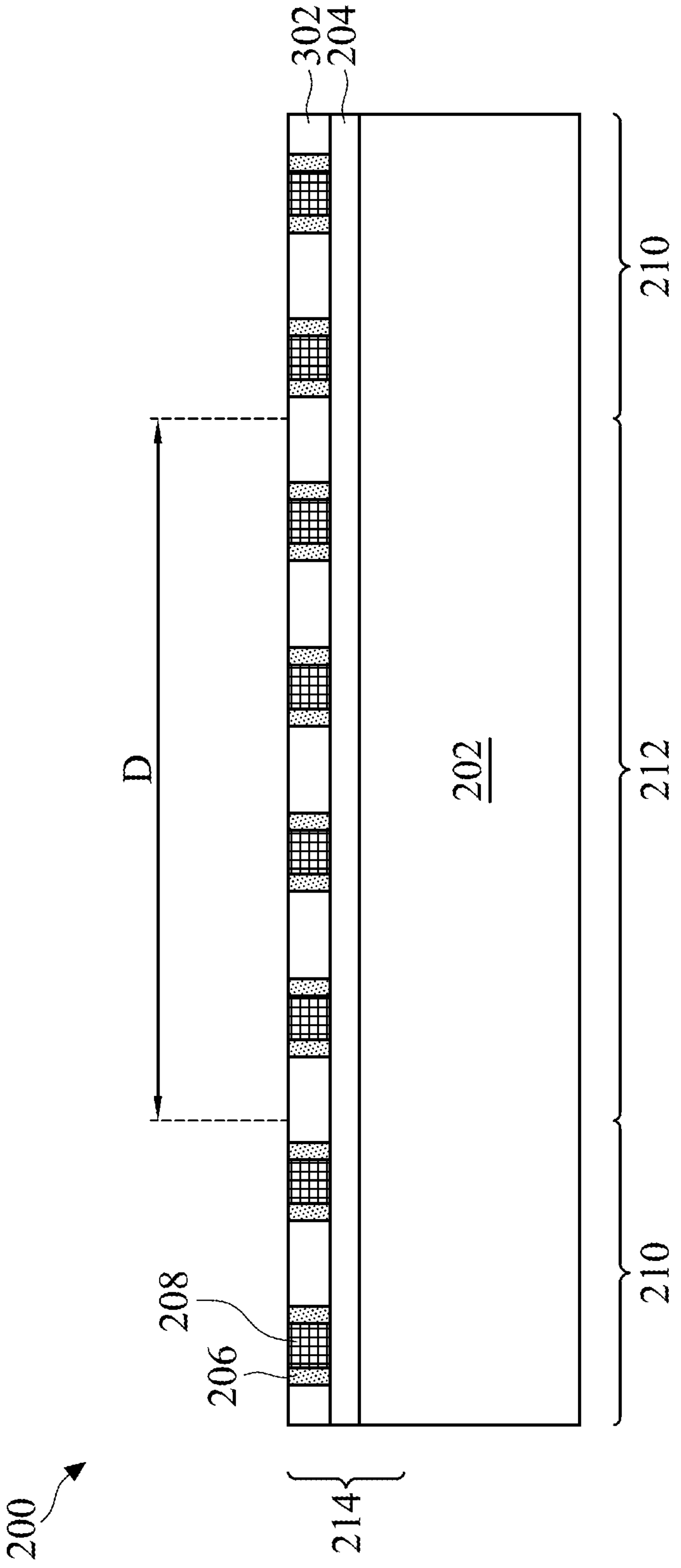
Figure 4:
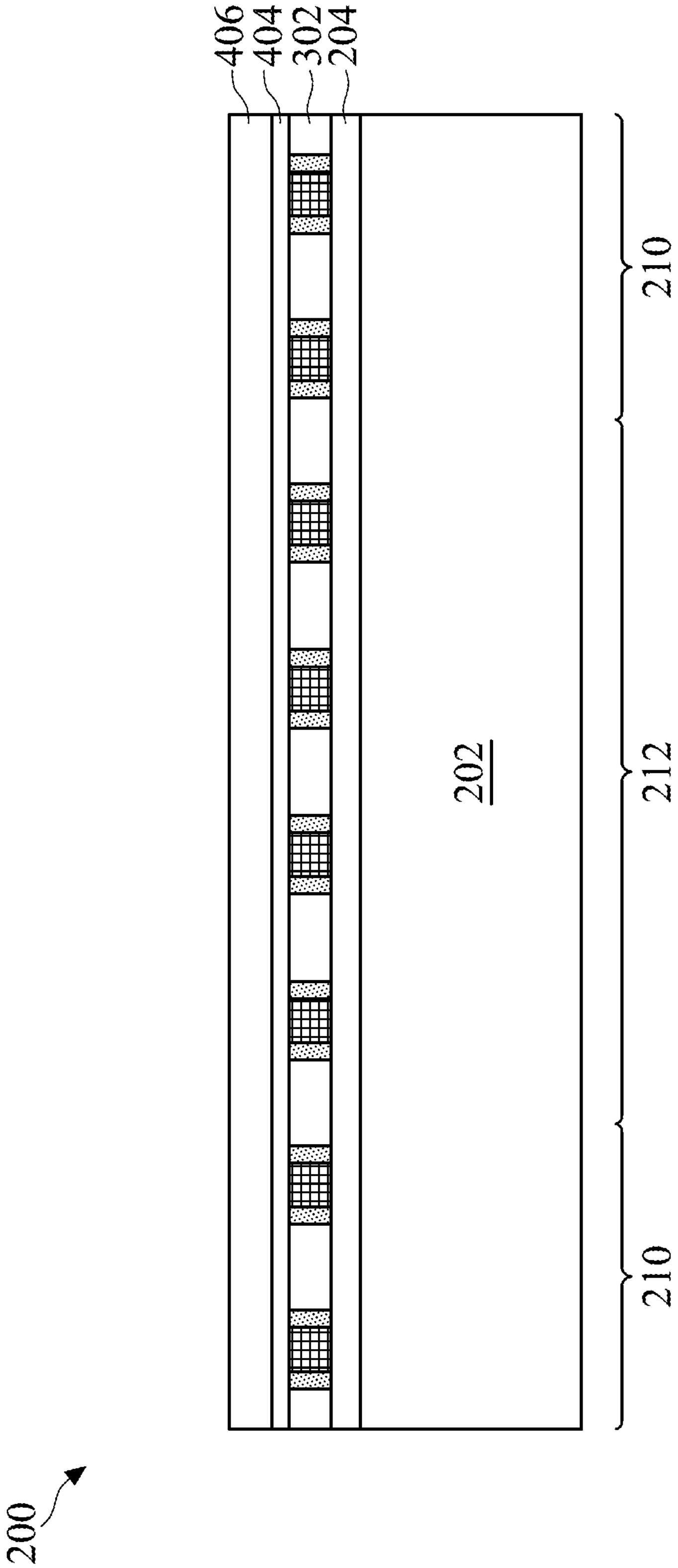

The dummy gate structures may be polysilicon and thus referred to as a poly gate (PG). The dummy gate structures are formed by suitable patterning and etching to form a dummy gate structure having sidewalls. The dummy gate structures may be configured substantially as illustrated in FIG. 3 and the illustration of the gate structures 208. On the sidewalls of the gate structures 208, spacer elements, also referred to simply as spacers, are formed as illustrated by spacers 206. In some embodiments, the spacers 206 are composed of silicon dioxide (SiO2), silicon oxynitride (SixOyNz), composite (SiO2/Si3N4), silicon nitride (Si3N4), and/or other suitable dielectrics. In some implementations, the spacers 206 can be formed by a blanket deposition of dielectric material or materials and isotropic etch back of these materials. The spacers 206 may in some implementations have a thickness ranging between 1 nm and 5 nm.

Block 106 continues to sub-step 106B where source/drain features are formed adjacent the dummy gate structures and spacer elements. The source/drain features are formed adjacent the dummy gate structures in the device region. In some implementations, the source/drain features are also formed adjacent the dummy gate structures in the TSV region. In an embodiment, the source/drain features are epitaxially grown from the active regions and/or recesses within the active regions (e.g., fins) adjacent the dummy gate structures.

In some implementations, the active regions and/or dummy gate structures in the through via region 212 be covered by a mask layer, such as a resist mask, to block epitaxial growth from occurring in the through via region 212. In other embodiments, the source/drain features may be also grown in the through via region 212, for example, concurrently with the source/drain features (e.g., P-type and/or N-type) of the device region 210.

The source/drain features may be deposited using vapor-phase epitaxy (VPE), ultra-high vacuum CVD (UHV-CVD), molecular beam epitaxy (MBE), and/or other suitable processes. When a source/drain feature is n-type, it may include silicon (Si) doped with an n-type dopant, such as phosphorus (P) or arsenic (As). When a source/drain feature is p-type, it may include silicon germanium (SiGe) doped with a p-type dopant, such as boron (B) or boron difluoride ($BF_2$). In some embodiments, the source/drain features may include multiple layers such as layers with different dopant concentrations.

Block 106 continues to sub-step 106C where a replacement gate (RPG) process is performed. The RPG process replaces the dummy gate structure (e.g., PG) discussed with reference to sub-step 106A with a functional gate structure such as a metal gate. It is noted that other methods of forming a gate structure may be provided in block 106, including other processes such as a gate-first process and the sub-steps 106A, 106B, and 106C are but an exemplary embodiment. The RPG process or other process of forming functional gates is performed on both the dummy gate structures of the device region 210 as well as the through via region 212.

In some implementations, after forming the dummy poly gate and spacers, the RPG process includes an inter-layer dielectric (ILD) layer that may be formed adjacent the dummy gate structures. As illustrated in FIG. 3, an ILD layer 302 is formed on the substrate 202. The ILD layer 302 may be deposited using PECVD, FCVD, spin-on coating, or a suitable deposition technique. In some embodiments, after formation of the ILD layer 302, the device 200 may be annealed to improve integrity of the ILD layer 302. Although not shown in figures, a contact etch stop layer (CESL) may be deposited before the ILD layer 302 is deposited such that the CESL is disposed between the ILD layer 302 and the source/drain features. The CESL may include silicon nitride or silicon oxynitride and may be deposited using CVD, ALD, or a suitable method.

After depositing the ILD layer 302, a planarization process is performed to expose a top surface of the dummy gate in the RPG process. The planarization process may include CMP. In some implementations, because of the dummy gate structures presence in the through via region 212, dishing of the ILD layer 302 in the through via region 212 may be avoided during the CMP process. Thus, a substantially planar surface of the ILD layer 302 from device region 210 across through via region 212 to device region 210 may be provided. After planarization, the dummy gate (e.g., polysilicon) is then removed to form a trench within a replacement gate is formed as discussed above. FIG. 3 illustrates the replacement gate, which is configurated substantially as the dummy gate structure, in gate structure 208. The gate structures 208 are disposed in both the device regions 210 and the through via region 212. In an embodiment, the gate structures 208 include a metal electrode and thus, are referred to as metal gates.

The gate structures 208 may include an interfacial layer interfacing the active region, a gate dielectric layer over the interfacial layer, and a gate electrode layer over the gate dielectric layer. The gate structures 208 extend from active regions over isolation structures 204 that are disposed between active regions. Over the isolation structures 204, the interfacial layer (if present) or the gate dielectric layer (if the interfacial layer is not present) interface the isolation structure 204. The interfacial layer of the gate structures 208 may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer of the gate structures 208 may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods. The gate electrode layer of the gate structures 208 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. At this stage, the gate structures 208 are also referred to as metal gate structures 208. In some embodiments, the gate structures 208 is the same structure throughout the device region 210 as well as the through via region 212. That is in some embodiments, the gate structures 208 in the device region 210 as well as in the through via region 212 is a metal gate.

The gate structures 208 and source/drain regions (not shown) are front-end-of-the-line (FEOL) structures 214. The FEOL structures 214 may also include diffusion regions in the substrate such as discussed above and STI features such as isolation structure 204.

The method 100 includes block 108 where a hard mask layer is formed over the FEOL structures including the gate structures and ILD layer in the device region and the through via region. In an embodiment, the hard mask layer includes a first layer and a second layer. In an embodiment, the first layer is titanium nitride (TiN). In an embodiment, the second layer is silicon nitride (SiN). Referring to the example of FIG. 4, a first layer 404 and a second layer 406 are illustrated. In some embodiments, the first layer 404 is TiN and the second layer 406 is SiN. The hard mask layer is as an etching mask during subsequent patterning steps.

The method 100 includes a block 110 where an opening is formed by etching processes, the opening being disposed in the through via region. The opening may be formed by patterning the hard mask layer of block 108, and using the patterned hard mask as an etching masking when etching the opening. The opening may extend through the mask layer of block 108 and the FEOL structures of block 106 in the through via region 212. Referring to the example of FIG. 5A, an opening 502 is formed.

The opening 502 may be patterned by suitable photolithography processes. For example, a masking element is formed over the hard mask layer 406 and an etching process is performed through openings in the masking element. The etching process may be a multi-step etchings process. In some embodiments, the etching process may first pattern the hard mask layer 406, and in subsequent etching using the patterned hard mask 406, the FEOL structures may be etched. The etching process(es) can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid (HNO3), and/or acetic acid (CH3COOH); or other suitable wet etchant. In an embodiment, a wet etch is performed followed by a dry etch. In some embodiments, a plurality of etching processes are performed. Each of the etches may include etchants selected based on the target material (e.g. dielectric, metal).

An embodiment of an exemplary etching flow provides for a multi-stage (e.g., three stage) etching process.

In a first etching process the hard mask layer(s) 404, 406 are removed. In an embodiment, the first etching process includes a wet etch targeting the hard mask layer such as implementing a solution of phosphoric acid, nitric acid, hydrofluoric acid, and/or other suitable etchants.

In a second etching process, the ILD and other FEOL devices such as metal gates 208 or source/drain regions are removed. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl^3$), a bromine-containing gas (e.g., HBr and/or $CHBR_3$), an iodine-containing gas, other suitable gases and/or plasmas, and/or combinations thereof.

Figure 5A:
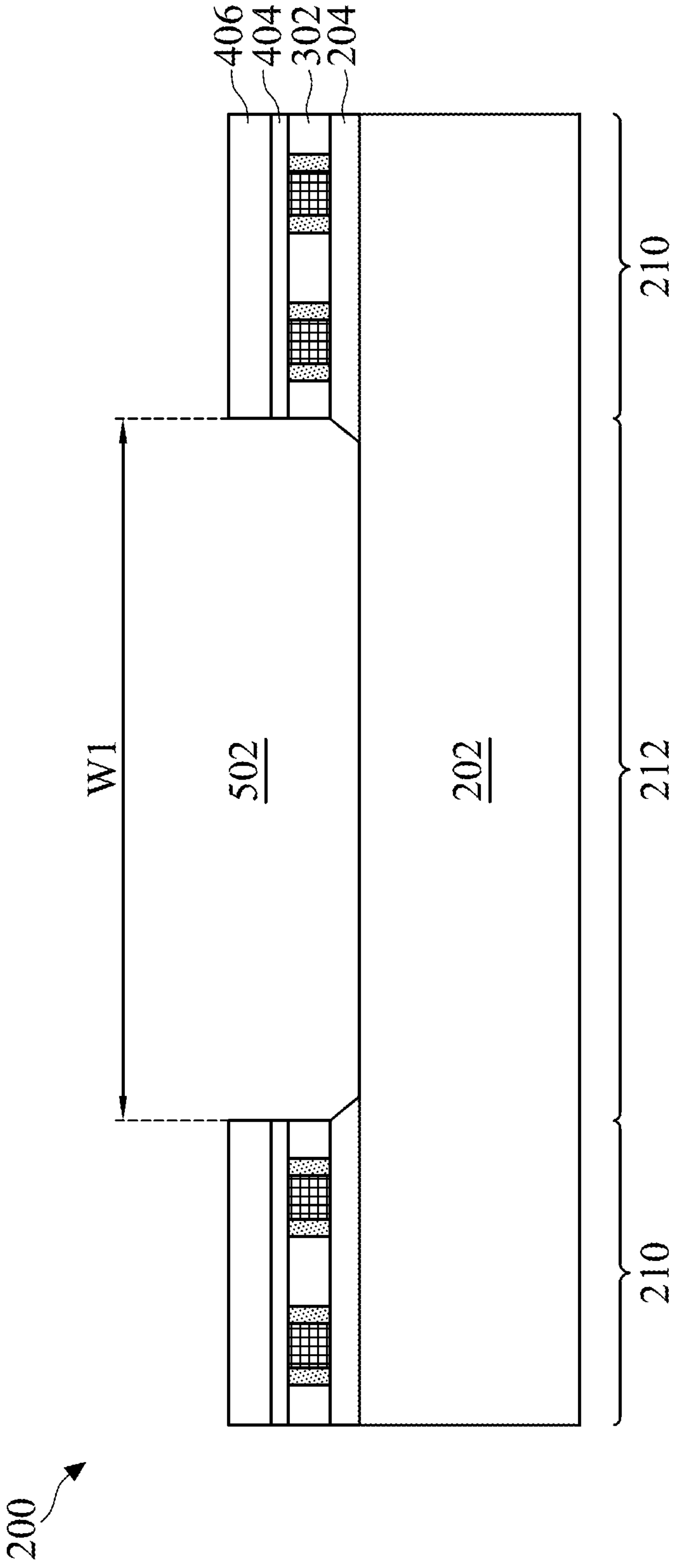
Figure 5B:
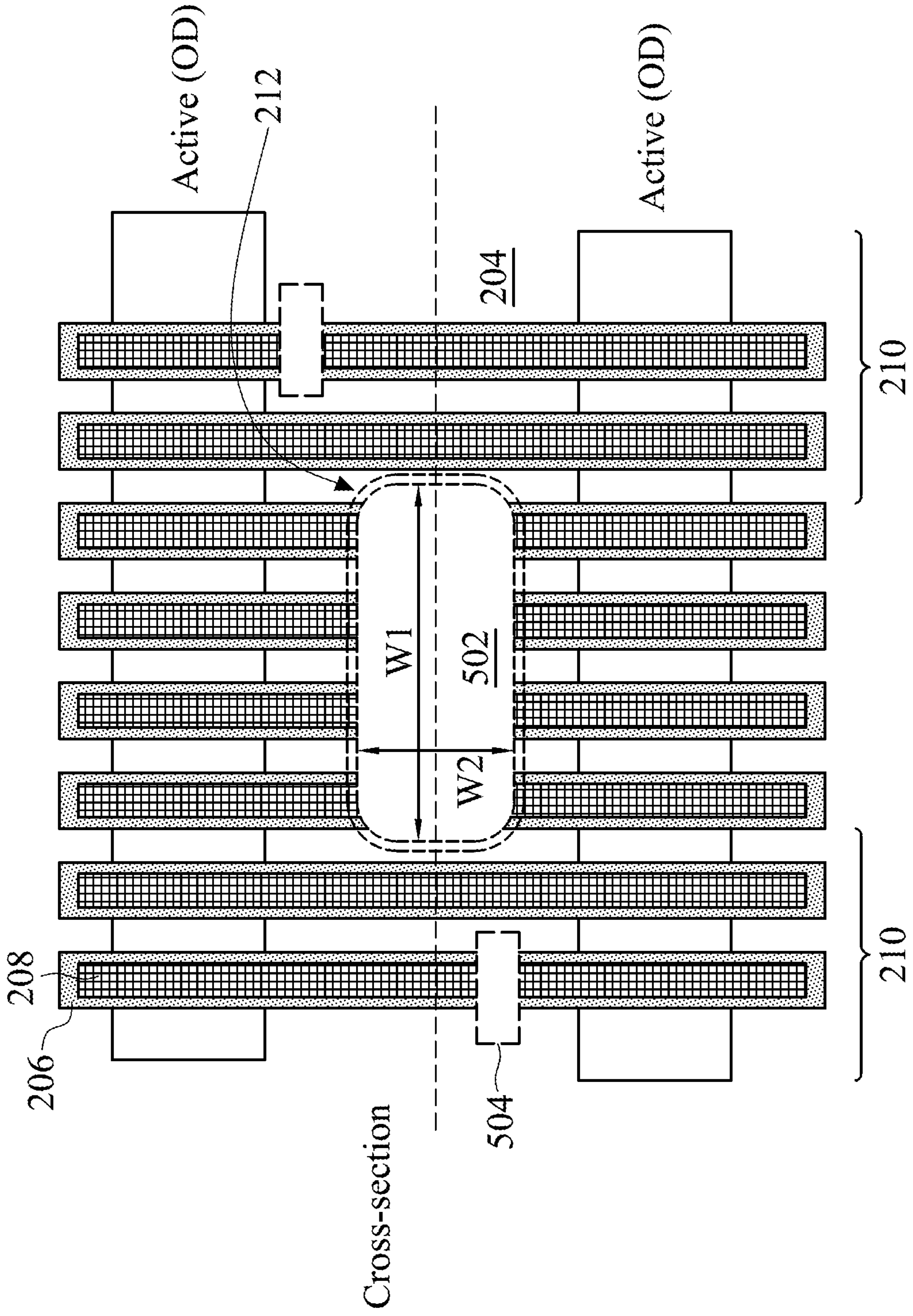
Figure 6:
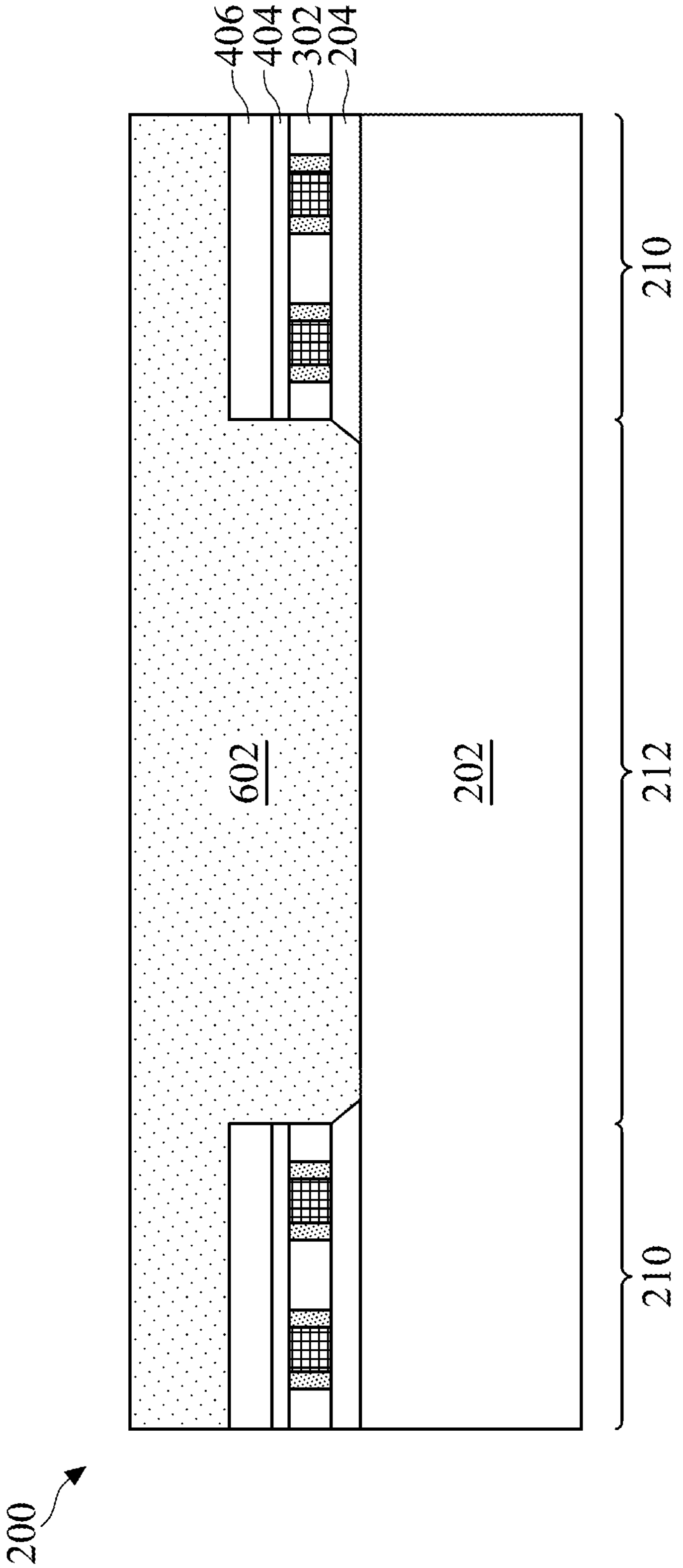

In a third etching process, the opening 502 is continued into the isolation structure 204 is etched. In an embodiment, the third etching process is a continuation of the second etching process. For example, in an embodiment, the isolation structure 204 is etched by a dry etching process implementing a fluorine-containing gas (e.g., $CF_4$, $SF_6$, $CH_2F_2$, $CHF_3$, and/or $C_2F_6$), As illustrated in the example of FIG. 5B, the opening 502 extends through the hard mask layer 406,404, through the ILD layer 302 and through the isolation structure 204. In some implementations, the opening 502 exposes a surface of the substrate 202. The opening 502 may have a dimension of D as discussed above. In some implementations, as illustrated, the opening 502 includes a dimension W1 and a dimension W2 as illustrated in the top view of FIG. 5B. In some implementations, W1 is substantially equal to W2 (e.g., circular, square). In other embodiments, W1 is greater than or less than W2. W1 and/or W2 may be greater than 5 microns.

In some implementations, the opening 502 is approximately circular in a top view. In some implementations, the opening 502 is of oval shape. In some implementations, the opening 502 is of a rectangular shape (including square) from a top view. These shapes are exemplary only and other shapes are possible including, for example, an octagonal shape. In some embodiments, the opening 502 is approximately the same shape and/or size of as the through via region 212. In some embodiments, the opening 502 has a shape that is substantially similar to the subsequently formed through via, discussed below. However, in other embodiments, the opening 502 may be of a different shape than the TSV subsequently formed. In each case, the opening 502 encases the TSV to be formed. In other words, the opening 502 is no larger than the TSV.

The top view of FIG. 5B illustrates active regions (OD) and isolation regions 204 formed in the device region 210. The through via region 212 is disposed such that device regions 210 surrounded the through via region 212, but other implementations are possible. For example, in some implementations, the through via region 212 may be an edge region of the device 200. The opening 502 is disposed over and extends through an isolation structure 204 over the substrate 202. That is, the opening 502 is within a through via region 212 disposed between active regions (OD). That is, the opening 502 is located in the isolation structure 204. In another embodiment, the through via region 212 and thus the opening 502 may extend over and/or be within an active region (OD) of the substrate 202. Gate structures 208 extend in a first direction and active regions extend in a second direction perpendicular to the first direction.

In some implementations, the patterning and etching of the opening 502 is performed concurrently with a gate cut region 504. A gate cut region 504 may be formed by a gate cut process where a contiguous gate structure 208 is "cut" into two segments. A gate cut region (e.g., opening or gap between first gate structure segment and the second gate structure segment) is an opening that extends between a first gate segment and a second gate segment of a gate line.

This opening is latter filled with dielectric material as discussed below, which provides for electrically isolation between the first gate segment and the second gate segment. That is, the cut region 504 defines a region where a portion of the gate structure 208 is removed to provide two discontinuous and disconnected gate structures. The two discontinuous gate structures may be provided over different active regions. It is noted that the opening 502 and the gate cut region 504 are formed after metal gate structures 208 have been formed. In other implementations of the method 100, the opening 502 and/or the gate cut region 504 are performed at the dummy polysilicon gate structure of sub-step 106A.

The cut gate opening 504 and the opening 502 may be formed concurrently. In an embodiment, a single mask is used in a photolithography process that defines the cut gate opening 504 and the opening 502. In some embodiments, the hard mask 404, 406 is patterned to be an etch mask for the etching of both the cut gate opening 504 and the opening 502. In some implementations, the etching processes discussed above for forming the opening 502 concurrently form the cut gate opening 504.

The method 100 proceeds to block 112 where the opening (s) of block 110 are filled with dielectric material. Referring to the example of FIG. 6, the opening 502 is filled with the dielectric material 602. In an embodiment, the opening 504, the cut-gate opening, is similarly filled with the dielectric material 602. The dielectric material filling the opening 504 may form a cut-gate isolation structure providing isolation between two adjacent gate segments.

The dielectric material 602 may be different than ILD layer 302 and/or the isolation structure 204 in material composition. In an embodiment, the dielectric material 602 is silicon nitride. In a further embodiment, the ILD layer 302 is an oxide such as silicon oxide. In a further embodiment, the isolation structure 204 includes an oxide such as silicon oxide. In some implementations, the dielectric material 602 interfaces the substrate 202, the isolation region 204, and the ILD layer 302 as shown in the cross-sectional view of FIG. 6. In an embodiment, the dielectric material 602 interfaces an end of a gate structure 208 (see top view of FIG. 7B). In an embodiment where the opening 502 extends over an active region, the dielectric material 602 may interface an active region of the substrate 202.

Figure 7A:
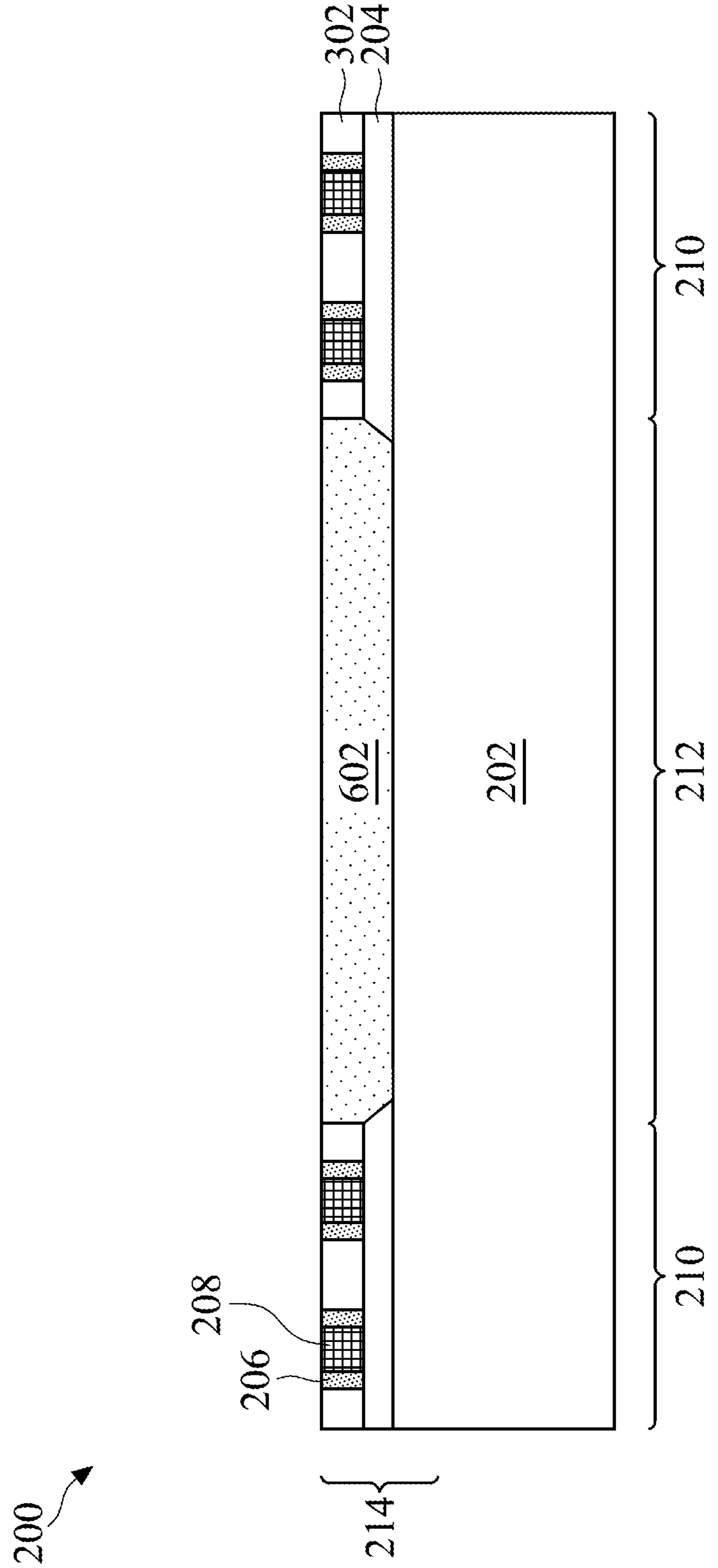
Figure 7B:
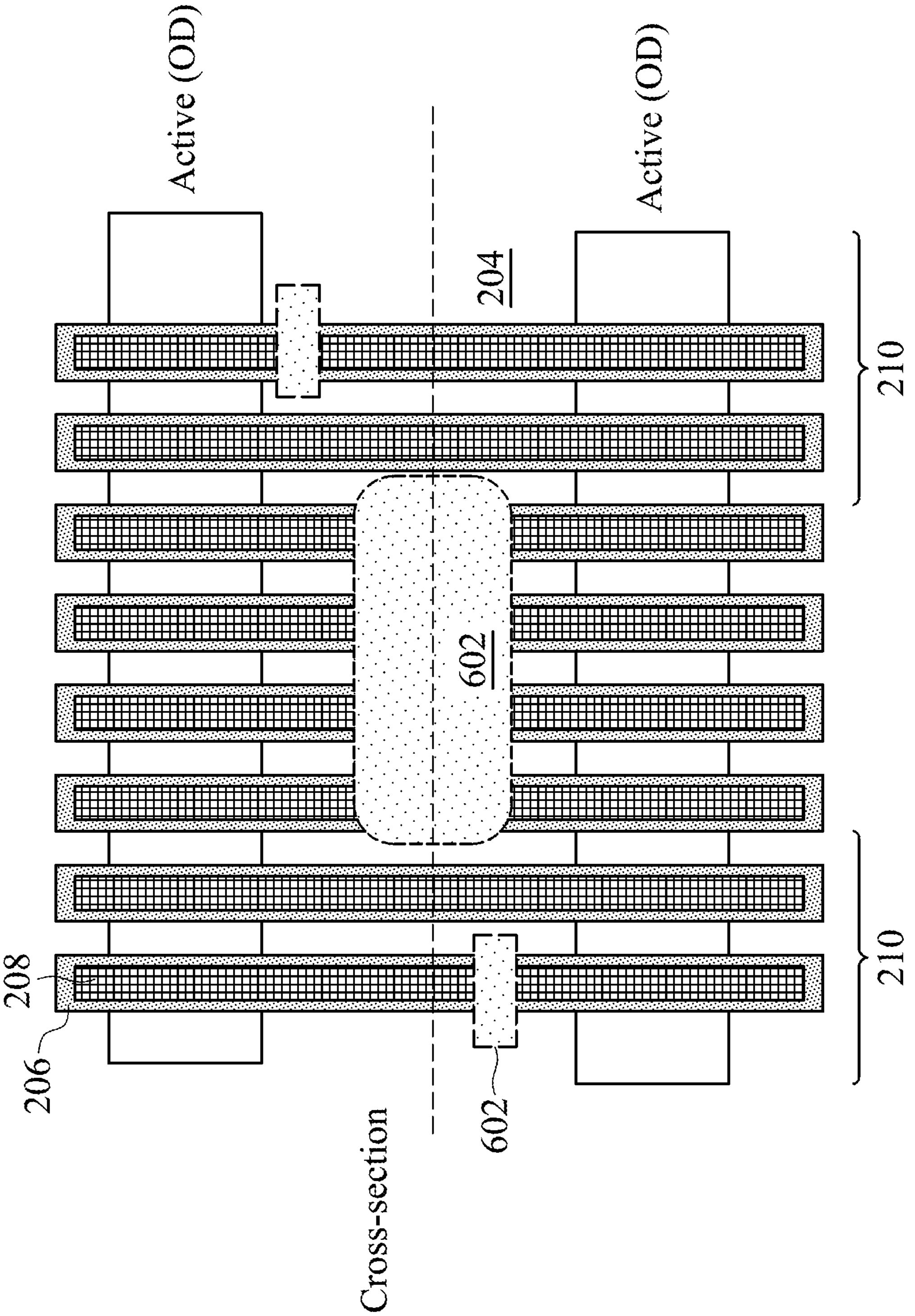
Figure 8:
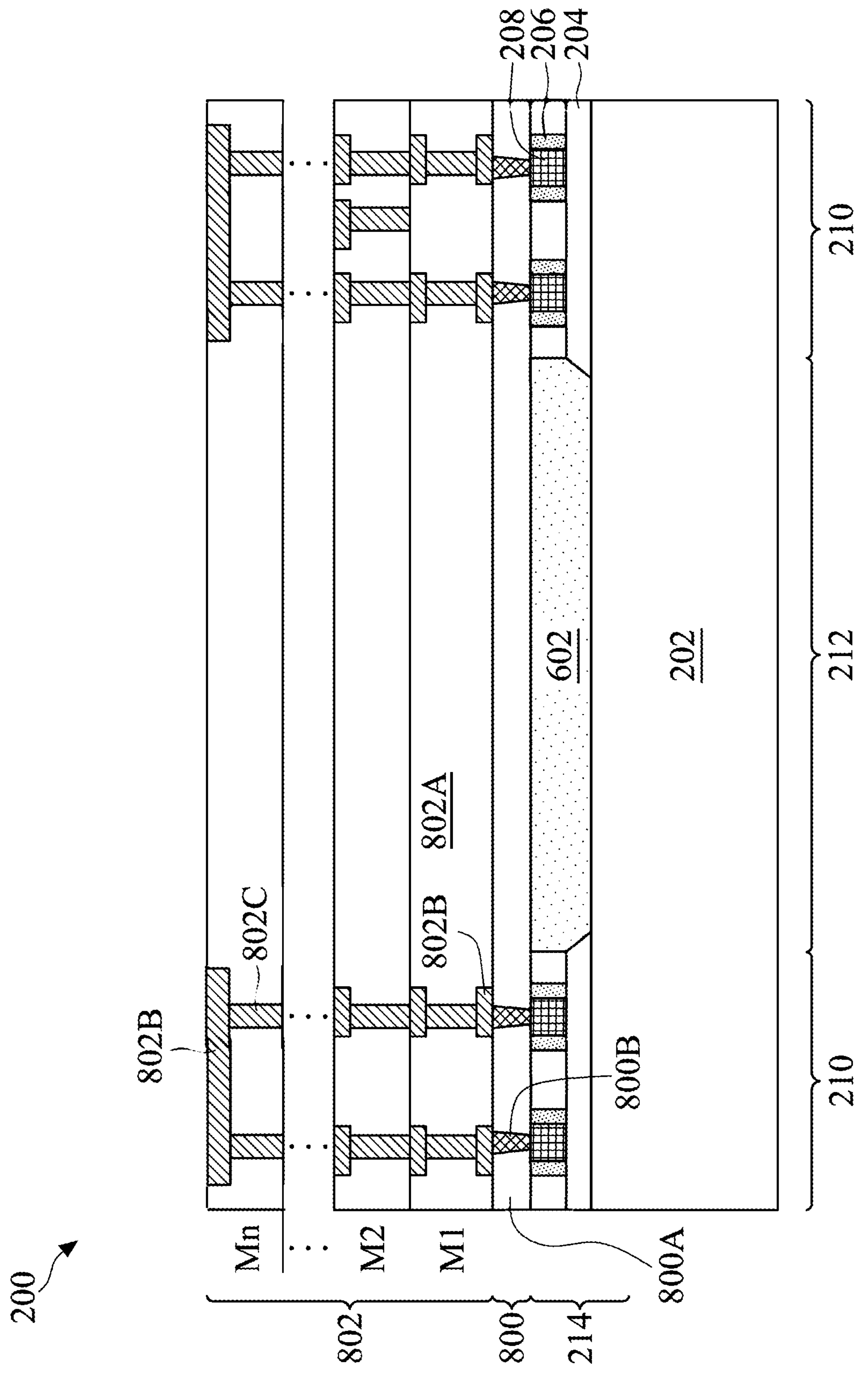

The method 100 includes a block 114 where a planarization process is performed after the deposition of the dielectric material of block 112 is performed. The planarization process may include chemical mechanical polishing (CMP) or other suitable etching back process. Referring to the example of FIG. 7A, the dielectric material 602 is planarized. The dielectric material 602 and the adjacent ILD layer 302 and/or gate structure 208 (including spacers 206) form a substantially planar upper surface as shown in FIG. 7A. The top view of FIG. 7B illustrates the opening 502 and the opening 504 filled with the dielectric material 602. As discussed above, in some implementations, both the opening 502 and the cut gate opening 504 are filled with a same material in a same deposition process.

Method 100 includes a block 116 where middle-of-the-line (MEOL) structures are formed over the substrate. The MEOL structures may include local interconnect structures and/or plugs providing connection to active devices of the active region of the substrate such as source/drain contact plugs to source/drain regions of a transistor or gate contact plugs to gate structures of a transistor. Referring to the example of FIG. 8, a MEOL layer 800 is formed over the substrate 202. The MEOL layer 800 includes an ILD layer 800A and contact plugs 800B. In an embodiment, the MEOL layer 800 includes gate contact plugs 800B, source/drain contact plugs (not shown) extending through the ILD layer 800A. Each gate contact plug 800B extends through the ILD layer 800A to be physically and electrically coupled to one of the gate structures 208. In some embodiments, the ILD layer 800A may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), and/or other suitable dielectric materials. In an embodiment, a dielectric material of the ILD layer 800A is different than that of the composition of the dielectric material 602.

The contact plugs 800B may include ruthenium (Ru), cobalt (Co), nickel (Ni), tungsten (W), copper (Cu), or other metals, as examples. In some embodiments, the contact plugs 800B may include a barrier layer to interface the ILD layer 800A. Such a barrier layer may include a metal nitride, such as titanium nitride, tantalum nitride, tungsten nitride, cobalt nitride, or nickel nitride. Additionally, in order to reduce contact resistance, a silicide feature may be disposed between the contact plug 800B and the transistor feature, such as gate 208. The silicide feature may include titanium silicide. The contact plug 800B may be deposited using CVD. PVD, or a suitable method. The formation of the MEOL layer 800 may conclude with a planarization process.

The method 100 includes a block 118 where back-end-of-the-line (BEOL) structures are formed in a BEOL process. The BEOL structures include a multi-layer interconnect (MLI) providing interconnections using metal line or via extending through dielectric layers. Referring to the example of FIG. 8, BEOL processes form BEOL layer 802 also referred to as MLI structure 802. The MLI structure 802 may include a plurality of metallization layers 802B such as eight (8) to thirteen (13) metallization layers, denoted as metallization layers M1-Mn. These metallization layers 802B typically provide horizontal routing. Vias 802C provide vertical routing connecting the metallization layers 802B. Generally, the metallization layers M1-Mn comprise layers of conductive wiring comprising conductive lines (e.g., metallization layers 802B extending laterally) and vias (e.g., vias 802C extending vertically between metal lines) to electrically couple to the MEOL structures 800, such as the plugs 800B. The layers of conductive wiring are formed in layers of a dielectric material, such as inter-metal dielectric (IMD) layers 802A. The IMD layers 802A may comprise a low dielectric constant or an extreme low dielectric constant (ELK) material, such as an oxide, $SiO_2$, borophosphosilicate glass (BPSG), TEOS, spin on glass (SOG), undoped silicate glass (USG), fluorinated silicate glass (FSG), high-density plasma (HDP) oxide, or plasma-enhanced TEOS (PE-TEOS). A planarization process, such as a CMP process, may be performed to planarize each of the IMD layers 802A.

The metallization layers including metallization layers 802B and vias 802C may be formed, for example, using a plating and etching process or through a damascene or dual-damascene process, in which openings are etched into the corresponding dielectric layer (IMD layer) and the openings are filled with a conductive material. The metallization layers 802B may be formed of any suitable conductive material, such as a highly-conductive metal, low-resistive metal, elemental metal, transition metal, or the like. In an embodiment the metallization layers 802B may be formed of copper, although other materials, such as tungsten, aluminum, gold, or the like, could alternatively be utilized. In an embodiment in which the metallization layers 802B are formed of copper, the metallization layers 802B may be deposited by electroplating techniques.

The metallization layers 802B and/or vias 802C may include a liner and/or a barrier layer. For example, a liner (not shown) may be formed over the dielectric layer in the openings, the liner covering the sidewalls and bottom of the opening. The liner may be either tetraethylorthosilicate (TEOS) or silicon nitride, although any suitable dielectric may alternatively be used. The liner may be formed using a plasma enhanced chemical vapor deposition (PECVD) process, although other suitable processes, such as physical vapor deposition or a thermal process, may alternatively be used. The barrier layer may be formed over the liner (if present) and covering the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The barrier layer may comprise tantalum nitride, although other materials, such as tantalum, titanium, titanium nitride, combinations of these, and the like may alternatively be used.

Figure 9:
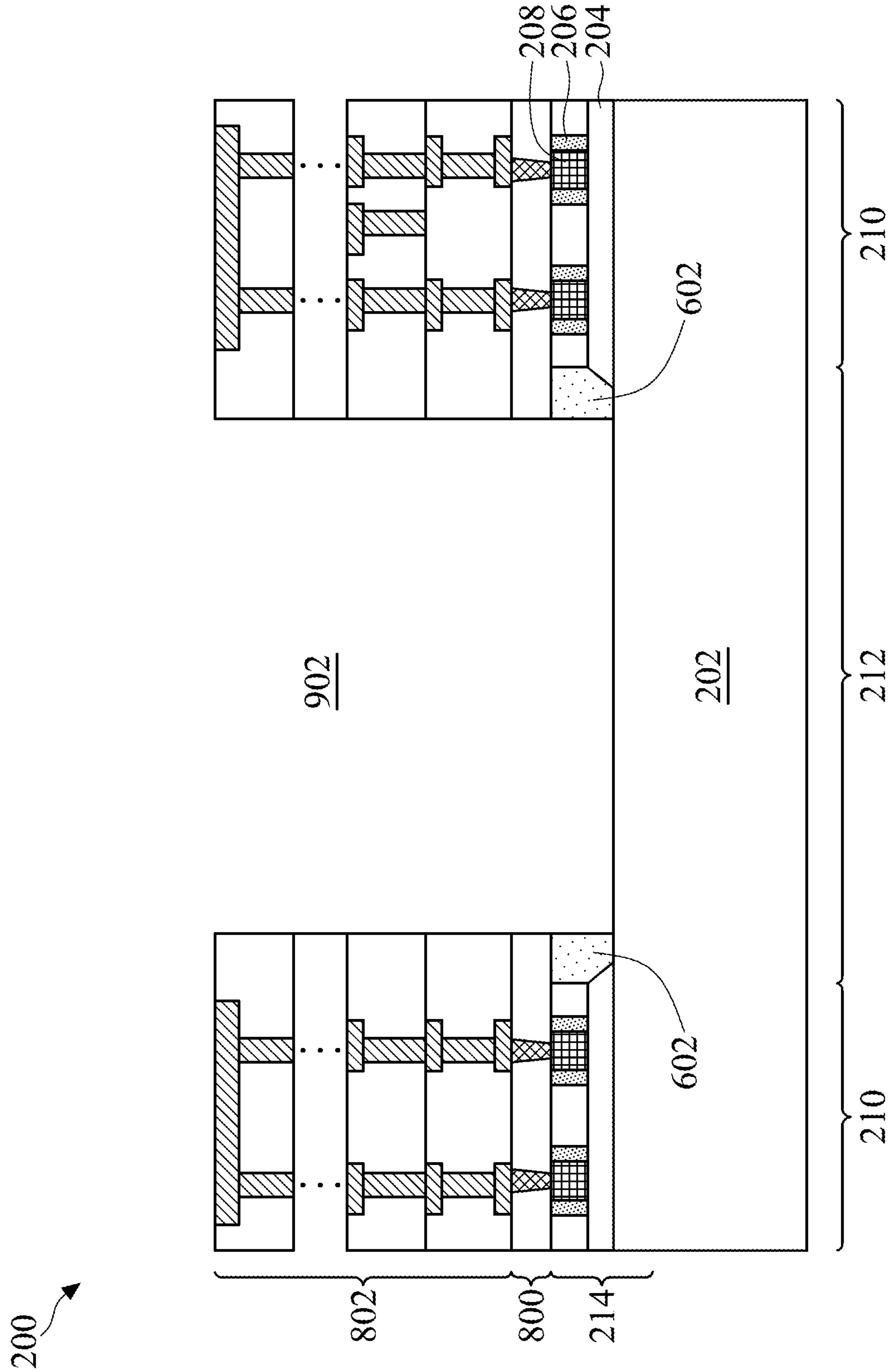
Figure 10:
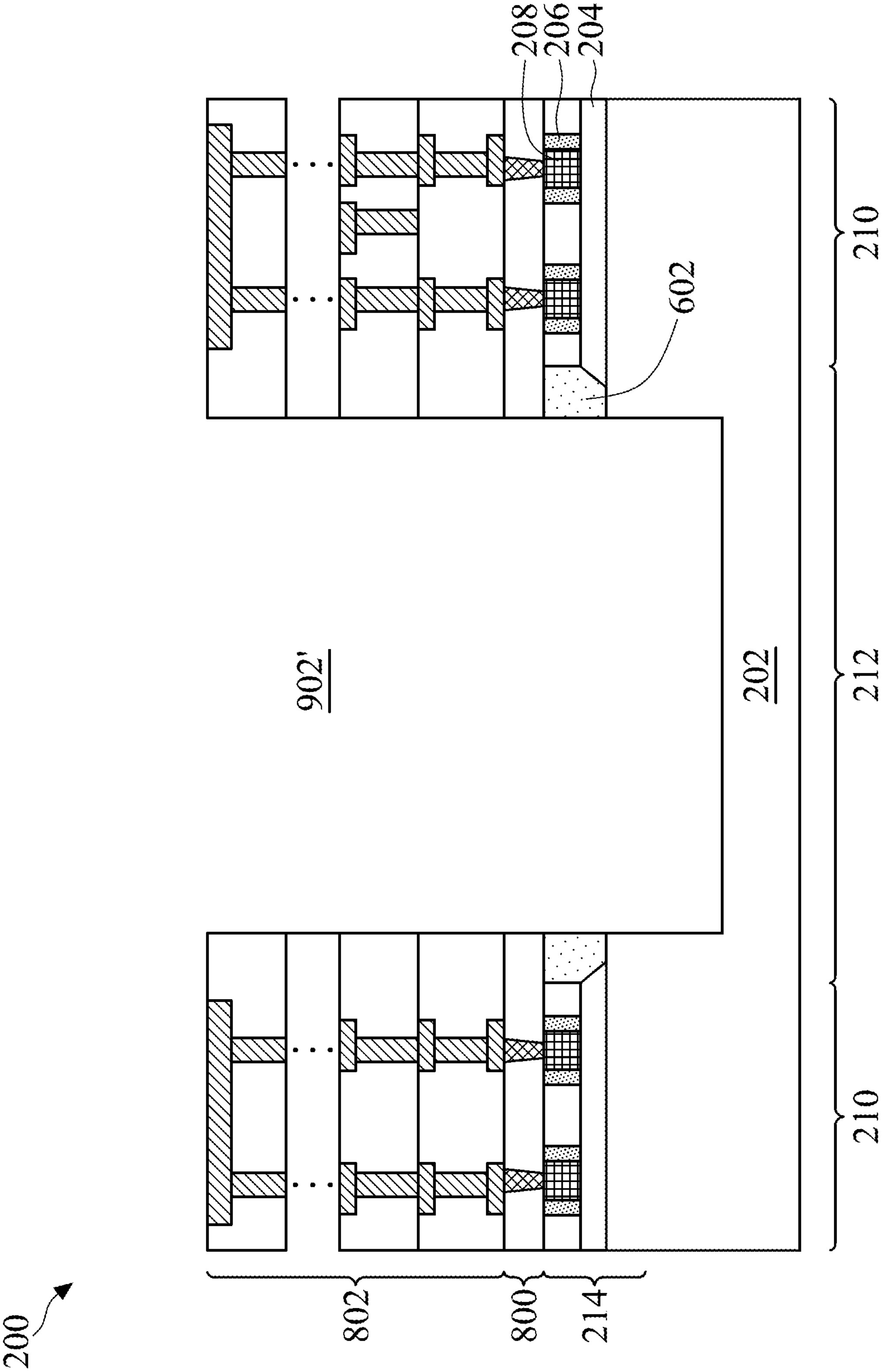
Figure 11:
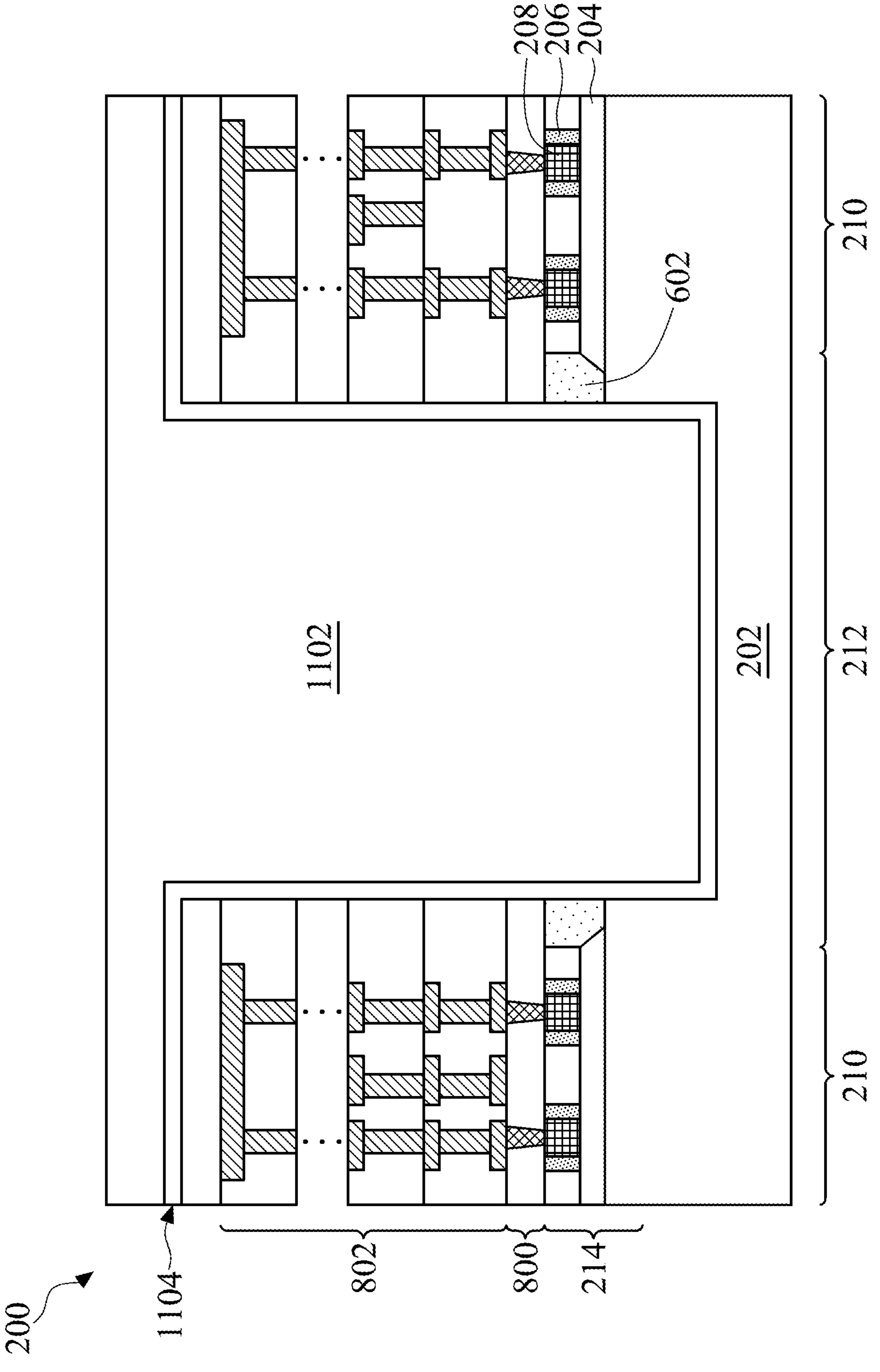

The method 100 includes block 120 where a through via opening is formed. The through via opening may be an opening or trench formed in the substrate and overlying layers, which when filled forms a through via or TSV. Referring to the example of FIG. 9, an opening 902 is formed through the BEOL structure 802, the MEOL structure 800, and the dielectric material 602. The opening 902 may be formed by suitable patterning and etching processes. For example, a masking layer may be formed over the BEOL structure 802. The masking layer may include photoresist, silicon oxide, silicon nitride, silicon carbide, aluminum oxide, or titanium nitride. The deposited masking layer then undergoes a pre-exposure baking process, exposure to radiation reflected from or transmitted through a photomask, a post-exposure baking process, and developing process, so as to form a patterned masking layer with an opening aligning with to-be formed opening 902. The etch process may be a dry etch process (e.g., a reactive ion etching (RIE) process). In some instances, an example dry etch process may implement an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof. In an implementation, the etching of opening 902 may include a first step where an etch is performed that stops at a top surface of the substrate 202 as illustrated in FIG. 9. The termination of the etching may be controlled by time or by an etch rate change. In an embodiment, the etching provides an opening 902 having substantially vertical sidewalls. In an implementation, the etching of opening 902 may include a second step where an etch is performed that extends through portion of the substrate 202 as illustrated in FIG. 10 forming extended opening 902'. The termination of the etching to form the extended opening 902' may be controlled by time. In an embodiment, the etching provides an opening 902' having substantially vertical sidewalls.

In some embodiments, the opening 902' has a width W3 that is less than the width W1 of the opening 502. In an embodiment, the opening 902 width W3 is a diameter which is less than the W1 dimension (e.g., width or diameter) of the opening 502. In other words, the opening 902' is within the dielectric material 602 filling the opening 502. As such residual portions of the dielectric material 602 surround the opening 902'. And a middle region of the sidewalls of the opening 902' is defined by the dielectric material 602. An upper region of the sidewalls of the opening 902' may be defined by IMD 802A of the BEOL layer 802 and the ILD layer 800A of the MEOL layer 800. A bottom region of the sidewalls of the opening 902' may be defined by the substrate 202. It is noted that in some implementations, dielectric regions are formed within the substrate 202 to isolation the through via formed in the opening 902'.

The method 100 includes a block 122 where a filling of the opening of block 120 with conductive material is performed to form a conductive through via. Referring to the example of FIG. 11, conductive materials 1102 and 1104 is deposited filling the opening 902'. And referring to the example of FIGS. 12A and 12B, a conductive through via 1200 is formed in the opening 902' from this conductive material. In some embodiments, the through via 1200 may include a barrier layer 1104 and a metal fill layer 1102. In some implementations, the barrier layer 1104 may include tantalum nitride (TaN), titanium nitride (TiN), tungsten nitride (WN), aluminum nitride (AlN), or combinations thereof. The metal fill layer 1102 may include copper (Cu), aluminum (Al), cobalt (Co), copper alloy, tantalum (Ta), titanium (Ti), or tungsten (W). In one embodiment, the barrier layer 1104 includes titanium nitride (TiN) and the metal fill layer 1102 includes copper (Cu). To form the conductive through via 1200, the barrier layer 1104 is first deposited using PVD, CVD, MOCVD, ALD, or a combination thereof as illustrated in the exemplary FIG. 11. Then, the metal fill layer 1102 is deposited using electroplating, PVD, CVD, electroless plating, or a suitable method. In one embodiment, the metal fill layer 1102 is formed using electroplating. In this embodiment, after the formation of the barrier layer 1104, a seed layer may be deposited, using PVD or a suitable process including over surfaces of the barrier layer 1104. Then the metal fill layer 1102 may be deposited over the seed layer using electroplating. In the embodiment where electroplating is used, the seed layer may include copper (Cu), titanium (Ti), or a combination thereof and the metal fill may include copper (Cu). The seed layer may be considered part of the metal fill layer 1102. After both the barrier layer 1104 and the metal fill layer 1102 are deposited into the opening 902', a planarization process, such as a CMP, may be performed to remove any excess material over an upper surface of the BEOL features 802 as illustrated in FIG. 12A.

Figure 12A:
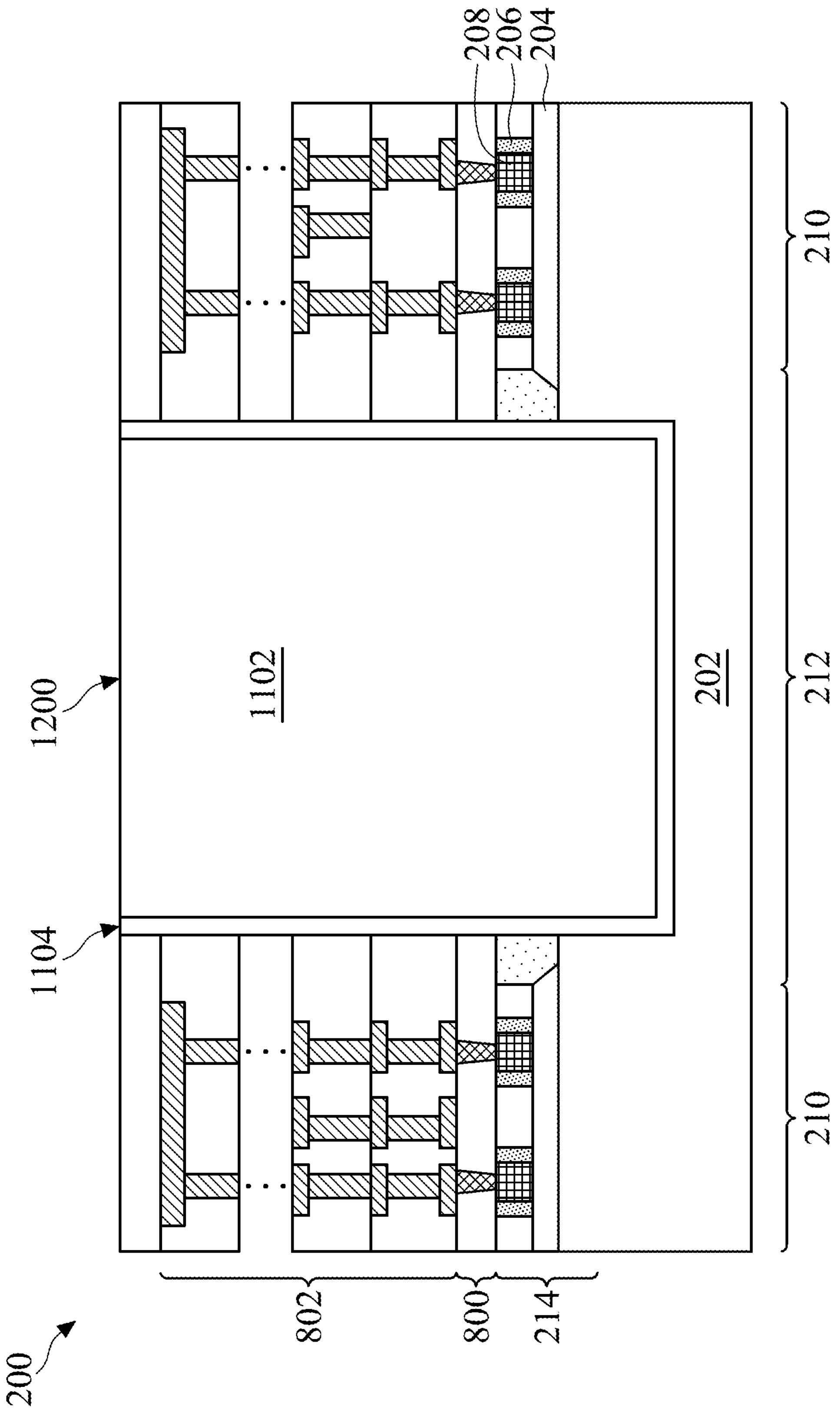
Figure 12B:
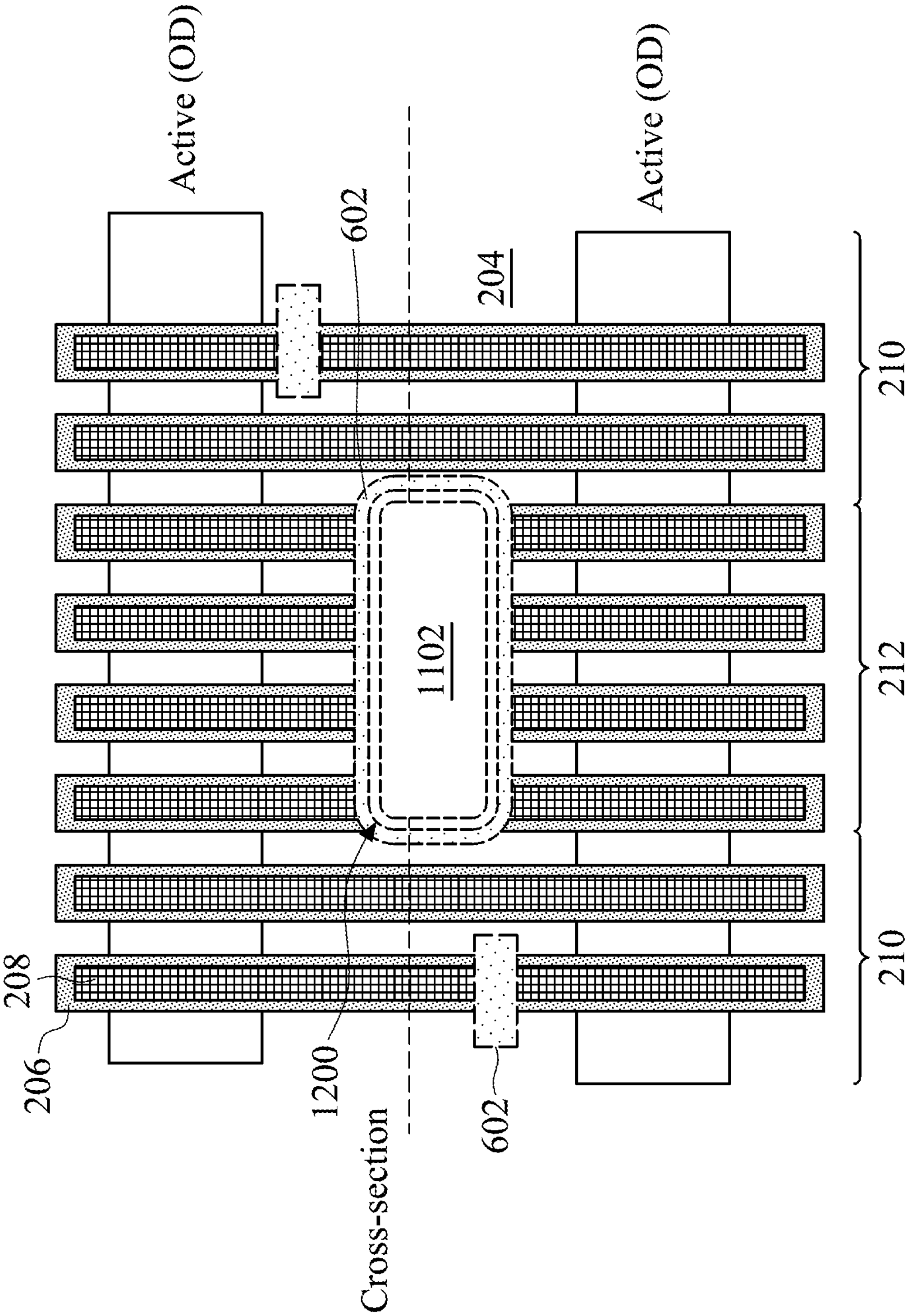

As illustrated in FIGS. 12A and 12B, in some implementations, the conductive through via 1200 is surrounded (at a lower portion) by the dielectric material 602. (It is noted that the top view of FIG. 12B does not illustrate the BEOL or MEOL features for case of illustration.) That is, the through via 1200 is disposed within the through via region 212 and the dielectric material 602.

Also referring to FIG. 12A, the gate structures 208 traversing the through via region 212 may be non-functional gates (e.g., dummy) including as extending over the active (OD) area. In other words, the gate structures 208 in the device region 212 above and below the through via 1200 in FIG. 12A may be non-functional or dummy gate structures. In other implementations, the segments of the gate structures 208 above and below the through via 1200 in FIG. 12A overlying the active regions (OD) may provide a functional gate. The functional gates 208 at the upper device region 210 (above the through via region 212 in FIG. 12B) may be isolated from collinear functional gate segment in the lower device region 210 by the dielectric material 602.

After forming the through via, the method 100 may continue to form additional conductive and/or insulative features over the substrate. Referring to the example of FIG. 13, an interconnect layer 1300 is formed over the through via 1200. The interconnect 1300 includes a conductive layer 1300B and an insulative layer 1300A. In some embodiments, the insulative layer 1300A may be substantially similar to the ILD layer 302, ILD 800A and/or the IMD layer 802A in terms of compositions and formation processes. In the depicted embodiments, the insulative layer 1300A may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. In an embodiment, a conductive feature or interconnect layer 1300B is formed over the through via 1200 and connected to the through via 1200. Exemplary metal material of the interconnect layer 1300B may include copper (Cu), cobalt (Co), nickel (Ni), aluminum (Al), or a metal alloy, such as aluminum-copper alloy (Al—Cu). After the deposition of the metal material and/or insulating material of the interconnect layer 1300, the device 200 is planarized using, for example, a CMP process to remove excess materials and provide a planar upper surface. The interconnect layer 1300 may further include additional layers such as passivation layers, bond pads, external interconnects such as solder balls, and the like.

Figure 13:
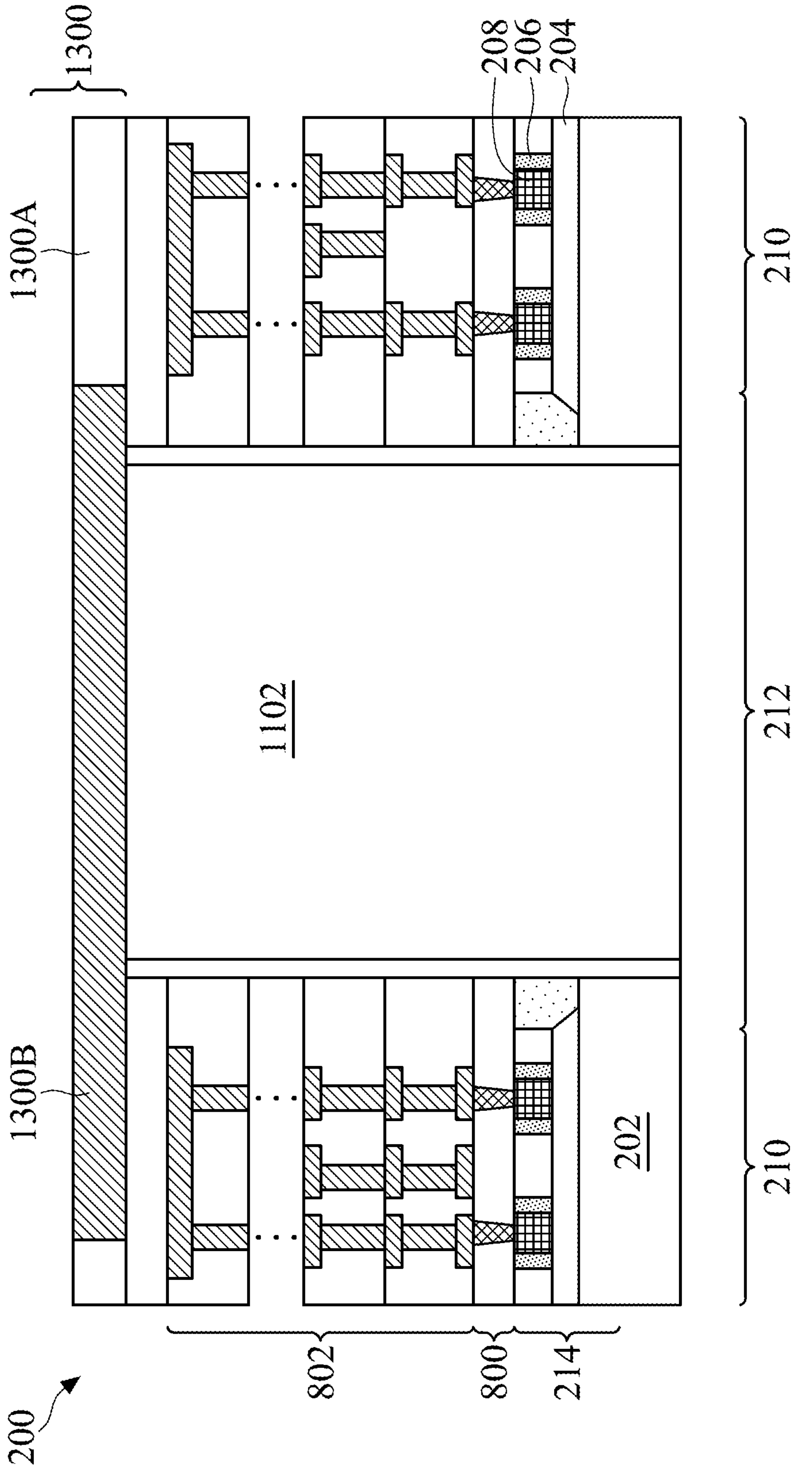

The method 100 includes a block 124 where further processes are performed including grinding and polishing the substrate to expose a bottom surface of the through via formed in block 122. In the example of FIG. 13, portions of the substrate 202 are removed as the substrate 202 is thinned. The removal continues such that a bottom surface of the through via 1200 is exposed. Once the bottom surface of the through via 1200 is exposed, the through via 1200 extends through the substrate 202. The through via 1200 is also termed as a through-silicon or through-substrate via (TSV) 1200.

Figure 14:
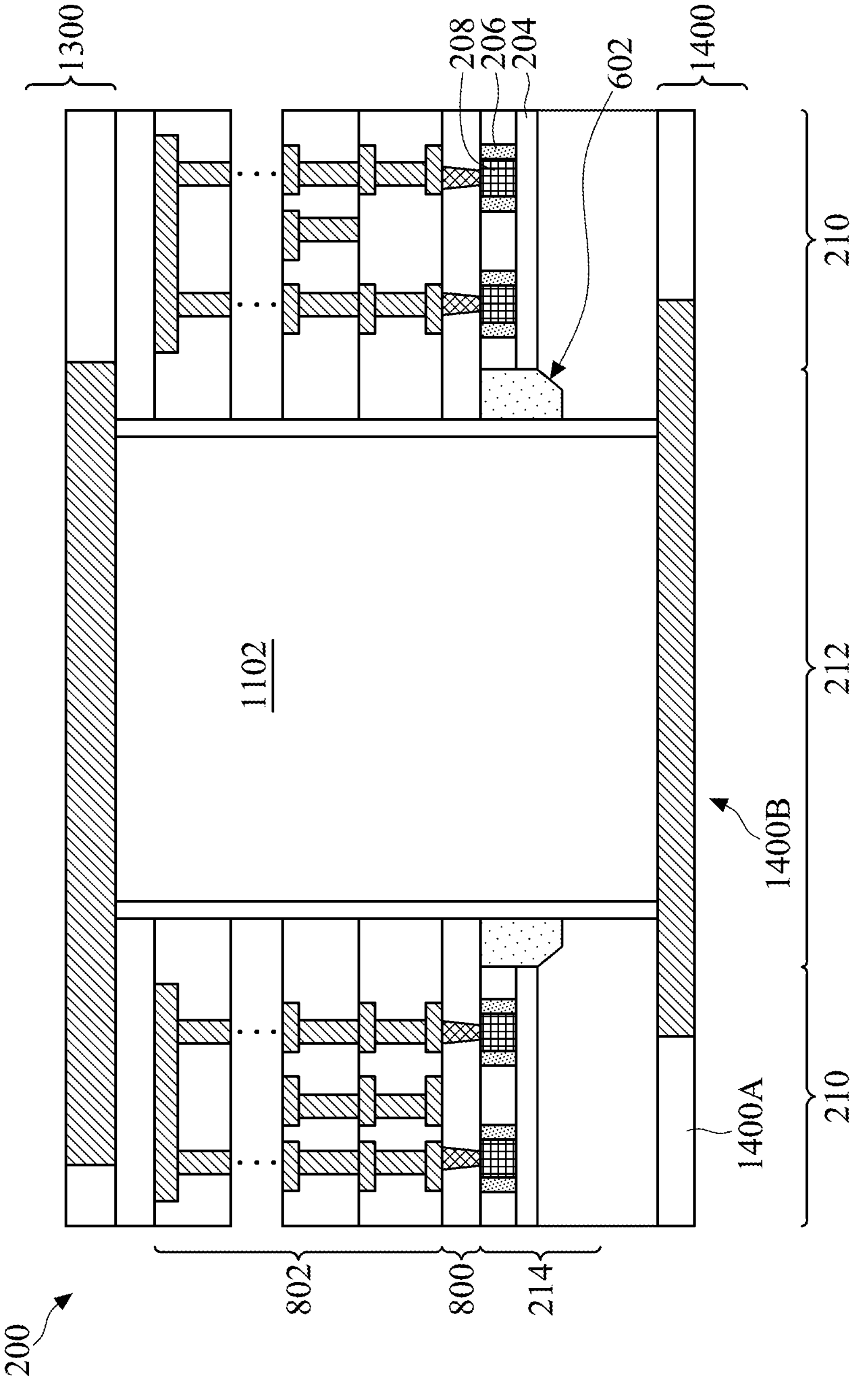

The method 100 includes a block 126 where further processing is performed. In an embodiment, after thinning the substrate, the method 100 may continue to form additional conductive and/or insulative features on the backside of the now-thinned substrate. Referring to the example of FIG. 14, an interconnect layer 1400 is formed on a backside of the substrate 202 adjacent the TSV 1200. The interconnect 1400 includes a conductive layer 1400B and an insulative layer 1400A. In some embodiments, the insulative layer 1400A may be substantially similar to the ILD layer 302, ILD 800A, the IMD layer 802A, and/or the insulative layer 1300A in terms of compositions and formation processes. In the depicted embodiments, the insulative layer 1400A may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. In an embodiment, a conductive feature or interconnect layer 1400B connected to the TSV 1200. Exemplary metal material of the interconnect layer 1400B may include copper (Cu), cobalt (Co), nickel (Ni), aluminum (Al), or a metal alloy, such as aluminum-copper alloy (Al—Cu). The interconnect layer 1400 may further include additional layers such as passivation layers, bond pads, external interconnects such as solder balls, and the like.

Thus, the method 100 and the exemplary device 200 illustrate embodiments providing, instead of extending through the substrate 202 in a region that is designed to be free of FEOL features, sacrificial FEOL features are formed concurrently with the active FEOL devices (e.g., metal gates). The sacrificial FEOL features are then removed to form the TSV 1200. Although not intended to be limiting, one or more embodiments of the present disclosure provide many benefits to a semiconductor device and the formation thereof. In some depicted embodiments, the processing avoids or mitigates dishing that can occur in regions without or with a lower density of features that can implicate later process steps. By forming sacrificial FEOL devices in the through via region 212, these processing affects can be mitigated.

In one exemplary aspect, the present disclosure is directed to a method. The method includes forming a first plurality of gate structures over a first region of a substrate and a second plurality of gate structures over a second region of the substrate. A first opening is formed by removing at least one of the second plurality of gate structures in the second region of the substrate. The first opening is filled with a first dielectric material. An interconnect layer is formed over the first plurality of gate structures and the first dielectric material and a second opening is etched through the interconnect layer, the first dielectric material, and through at least a portion of the second region of the substrate. The method also includes forming a via structure within the second opening, the via structure extending through the interconnect layer, the first dielectric material, and the second region of the substrate.

In a further embodiment, forming the first plurality of gate structures and the second plurality of gate structures in the method includes forming polysilicon gate structures, removing the polysilicon gate structures to form a trench, and forming a metal gate electrode in the trench. In an embodiment, the first dielectric material is silicon nitride. In a further embodiment, forming the interconnect layer includes forming an intermetal dielectric (IMD) layer and a metal interconnect layer. And the IMD layer may comprise a second dielectric material different than the first dielectric material.

In an embodiment, concurrent with the forming the first opening, forming a third opening providing a cut-gate region in a first gate of the first plurality of gate structures in the first region of the substrate. In a further embodiment, concurrently with filling the first opening, filling the third opening with the first dielectric material.

In an embodiment, the method also includes forming an interlayer dielectric (ILD) layer adjacent and interposing the first plurality of gate structures and adjacent and interposing the second plurality of gate structures. In an implementation, the ILD layer is silicon oxide and the first dielectric material is silicon nitride. In an embodiment of the method, after the forming of the via structure, the first dielectric material remains abutting sidewalls of the via structure.

In another exemplary aspect, the present disclosure is directed to a method of forming a semiconductor device. The method includes forming a first plurality of metal gates on a substrate and providing an interlayer dielectric (ILD) adjacent the metal gates. A first opening and a second opening are etched—the first opening extends into the ILD and through a first metal gate and a second metal gate of the first plurality of metal gates and the second opening extends through a third metal gate of the first plurality of metal gates to form a gate cut region. The method also includes filling the first opening and the second opening with a dielectric material and after the filling the first opening and the second opening, depositing an interconnect layer over the substrate. The interconnect layer is etched to form a via opening, wherein the via opening extends through the dielectric material and conductive material is deposited in the via opening to form a via structure.

In a further embodiment, the method includes thinning a backside of the substrate to expose the via structure. In some implementations, the sidewalls of the via structure interface the dielectric material. In an embodiment the method also includes depositing a hard mask layer over the ILD and the first plurality of metal gate; and defining a pattern of the first opening and the second opening in the hard mask layer. And in an embodiment, the opening is formed over a shallow trench isolation structure disposed on the substrate. The method may further include forming the first plurality of metal gates includes forming the first plurality of metal gates over fin-type active regions extending from the substrate.

In yet another exemplary aspect, the present disclosure is directed to a semiconductor structure. A structure includes a substrate and a plurality of gate structures disposed on the substrate. A multi-layer interconnect (MLI) is disposed over the substrate and the plurality of gate structures. A through substrate via extends vertically through the substrate and the MLI. In an embodiment, the through substrate via has a first sidewall in a cross-sectional view. The first sidewall includes an upper portion interfacing a first dielectric material of the MLI; a middle portion interfacing a second dielectric material, the second dielectric material different than the first dielectric material; and a lower portion interfacing the substrate.

In an embodiment, the second dielectric material surrounds the middle portion of the through substrate via in a top view. In an embodiment, the first dielectric material is an oxide and the second dielectric material is silicon nitride. And in some implementations, at least part of the middle portion of the first sidewall is coplanar with the plurality of gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, the method comprising:

forming a first plurality of gate structures over a first region of a substrate and a second plurality of gate structures over a second region of the substrate;

forming a first opening by removing at least one of the second plurality of gate structures in the second region of the substrate;

filling the first opening with a first dielectric material;

forming an interconnect layer over the first plurality of gate structures and the first dielectric material;

etching a second opening through the interconnect layer, the first dielectric material, and through at least a portion of the second region of the substrate; and forming a via structure within the second opening, the via structure extending through the interconnect layer, the first dielectric material, and the second region of the substrate.

2. The method of semiconductor device fabrication of claim 1, wherein the forming the first plurality of gate structures and the second plurality of gate structures includes:

forming polysilicon gate structures;

removing the polysilicon gate structures to form a trench; and forming a metal gate electrode in the trench.

3. The method of semiconductor device fabrication of claim 1, wherein the first dielectric material is silicon nitride.

4. The method of semiconductor device fabrication of claim 3, wherein the forming the interconnect layer includes forming an intermetal dielectric (IMD) layer and a metal interconnect layer.

5. The method of semiconductor device fabrication of claim 4, wherein the IMD layer comprises a second dielectric material different than the first dielectric material.

6. The method of semiconductor device fabrication of claim 1, wherein concurrent with the forming the first opening, forming a third opening providing a cut-gate region in a first gate of the first plurality of gate structures in the first region of the substrate.

7. The method of semiconductor device fabrication of claim 6, further comprising:

concurrently with filling the first opening, filling the third opening with the first dielectric material.

8. The method of semiconductor device fabrication of claim 1, further comprising:

forming an interlayer dielectric (ILD) layer adjacent and interposing the first plurality of gate structures and adjacent and interposing the second plurality of gate structures.

9. The method of semiconductor device fabrication of claim 8, wherein the ILD layer is silicon oxide and the first dielectric material is silicon nitride.

10. The method of semiconductor device fabrication of claim 1, wherein after the forming of the via structure, the first dielectric material remains abutting sidewalls of the via structure.

11. A method of forming a semiconductor device, comprising:

forming a first plurality of metal gates on a substrate;

providing an interlayer dielectric (ILD) adjacent the metal gates;

etching a first opening and a second opening, wherein the first opening extends into the ILD and through a first metal gate and a second metal gate of the first plurality of metal gates and the second opening extends through a third metal gate of the first plurality of metal gates to form a gate cut region;

filling the first opening and the second opening with a dielectric material;

after the filling the first opening and the second opening, depositing an interconnect layer over the substrate;

etching the interconnect layer to form a via opening, wherein the via opening extends through the dielectric material; and depositing conductive material in the via opening to form a via structure.

12. The method of claim 11, further comprising:

thinning a backside of the substrate to expose the via structure.

13. The method of claim 11, wherein sidewalls of the via structure interface the dielectric material.

14. The method of claim 11, further comprising:

depositing a hard mask layer over the ILD and the first plurality of metal gates; and defining a pattern of the first opening and the second opening in the hard mask layer.

15. The method of claim 11, wherein the first opening is formed over a shallow trench isolation structure disposed on the substrate.

16. The method of claim 11, wherein the forming the first plurality of metal gates includes forming the first plurality of metal gates over fin-type active regions extending from the substrate.

17. A method of fabricating a semiconductor structure, the method comprising:

forming a plurality of metal gates extending in a first direction in a top view;

forming a dielectric layer interposing the plurality of metal gates in a second direction in the top view;

using an etching process, removing a first portion of each of at least two metal gates of the plurality of metal gates to form a first opening;

filling the first opening with an insulating material;

forming an interlayer dielectric (ILD) stack over the filled first opening;

using an etching process, forming a second opening extending through the ILD stack and the filled first opening; and filling the second opening with conductive material.

18. The method of claim 17, wherein the first opening is circular in the top view.

19. The method of claim 17, wherein a portion of the filled first opening remains after the forming the second opening.

20. The method of claim 19, wherein the forming the second opening includes forming the second opening having a sidewall defined by the filled first opening.

* * * * *